United States Patent
Kuribayashi et al.

(10) Patent No.: US 12,178,047 B2
(45) Date of Patent: Dec. 24, 2024

(54) SEMICONDUCTOR STORAGE DEVICE AND METHOD OF MANUFACTURING SEMICONDUCTOR STORAGE DEVICE

(71) Applicant: Kioxia Corporation, Tokyo (JP)

(72) Inventors: Gen Kuribayashi, Yokkaichi Mie (JP); Shigeki Kobayashi, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/403,916

(22) Filed: Jan. 4, 2024

(65) Prior Publication Data
US 2024/0147724 A1 May 2, 2024

Related U.S. Application Data

(63) Continuation of application No. 17/684,834, filed on Mar. 2, 2022.

(30) Foreign Application Priority Data
Sep. 16, 2021 (JP) ................. 2021-151000

(51) Int. Cl.
| | | |
|---|---|---|
| *H10B 43/27* | (2023.01) | |
| *G11C 16/04* | (2006.01) | |
| *H10B 41/10* | (2023.01) | |
| *H10B 41/27* | (2023.01) | |
| *H10B 41/35* | (2023.01) | |

(Continued)

(52) U.S. Cl.
CPC ......... *H10B 43/27* (2023.02); *G11C 16/0483* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 43/10; H10B 43/35; H10B 43/40; H10B 41/10; H10B 41/27; H10B 41/35; G11C 16/0483; G11C 16/16
See application file for complete search history.

(56) References Cited

U.S. PATENT DOCUMENTS

| | | |
|---|---|---|
| 2014/0209998 A1 | 7/2014 | Masuoka et al. |
| 2018/0047748 A1 | 2/2018 | Choi et al. |

(Continued)

FOREIGN PATENT DOCUMENTS

| | | |
|---|---|---|
| TW | I574387 B | 3/2017 |
| TW | 202133397 A | 9/2021 |

*Primary Examiner* — Sultana Begum
(74) *Attorney, Agent, or Firm* — Kim & Stewart LLP

(57) ABSTRACT

A semiconductor storage includes a stack, columns, and first, second, third, fourth, and fifth insulators. The stack includes first conductive layers, and second and third conductive layers below and above the first conductive layers, respectively. The columns penetrate the stack in a first direction. The first and second insulators penetrate the stack and are separated from each other in a second direction. The third insulator is between the first and second insulators in a third direction. The third insulator includes first and second portions apart from each other in the second direction. The fourth insulator is between the first and second portions. The fifth insulator is between the first and second portions above the fourth insulator. The second conductive layer includes two electrically-separated regions, between which the third and fourth insulators are provided. The third conductive layer includes two electrically-separated regions between which the third and fifth insulators are provided.

12 Claims, 29 Drawing Sheets

(51) Int. Cl.
*H10B 43/10* (2023.01)
*H10B 43/35* (2023.01)

(56) References Cited

U.S. PATENT DOCUMENTS

| | | |
|---|---|---|
| 2019/0096899 A1 | 3/2019 | Tagami et al. |
| 2020/0194453 A1 | 6/2020 | Lim |
| 2020/0395375 A1 | 12/2020 | Huo et al. |
| 2021/0265387 A1 | 8/2021 | Oike |

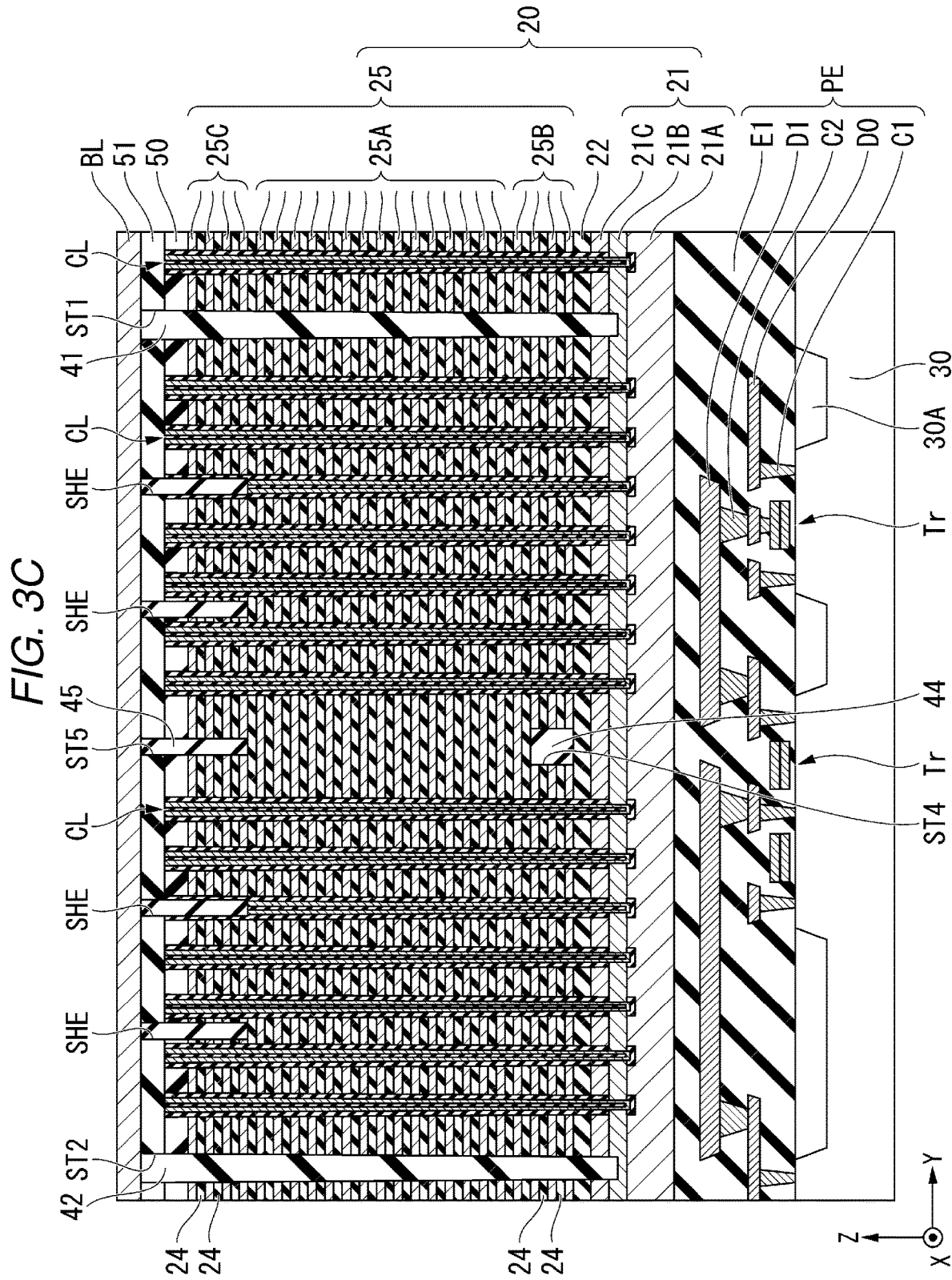

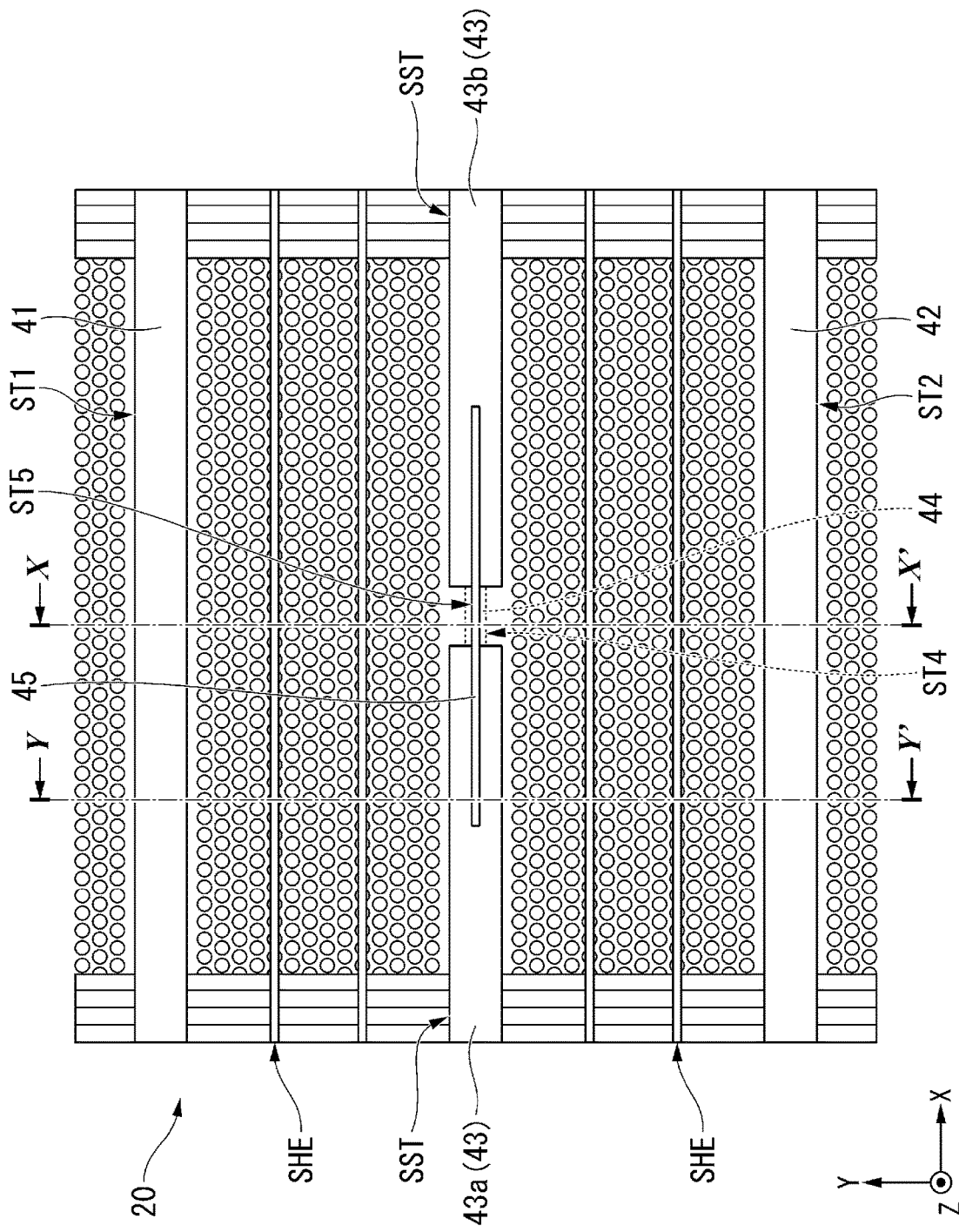

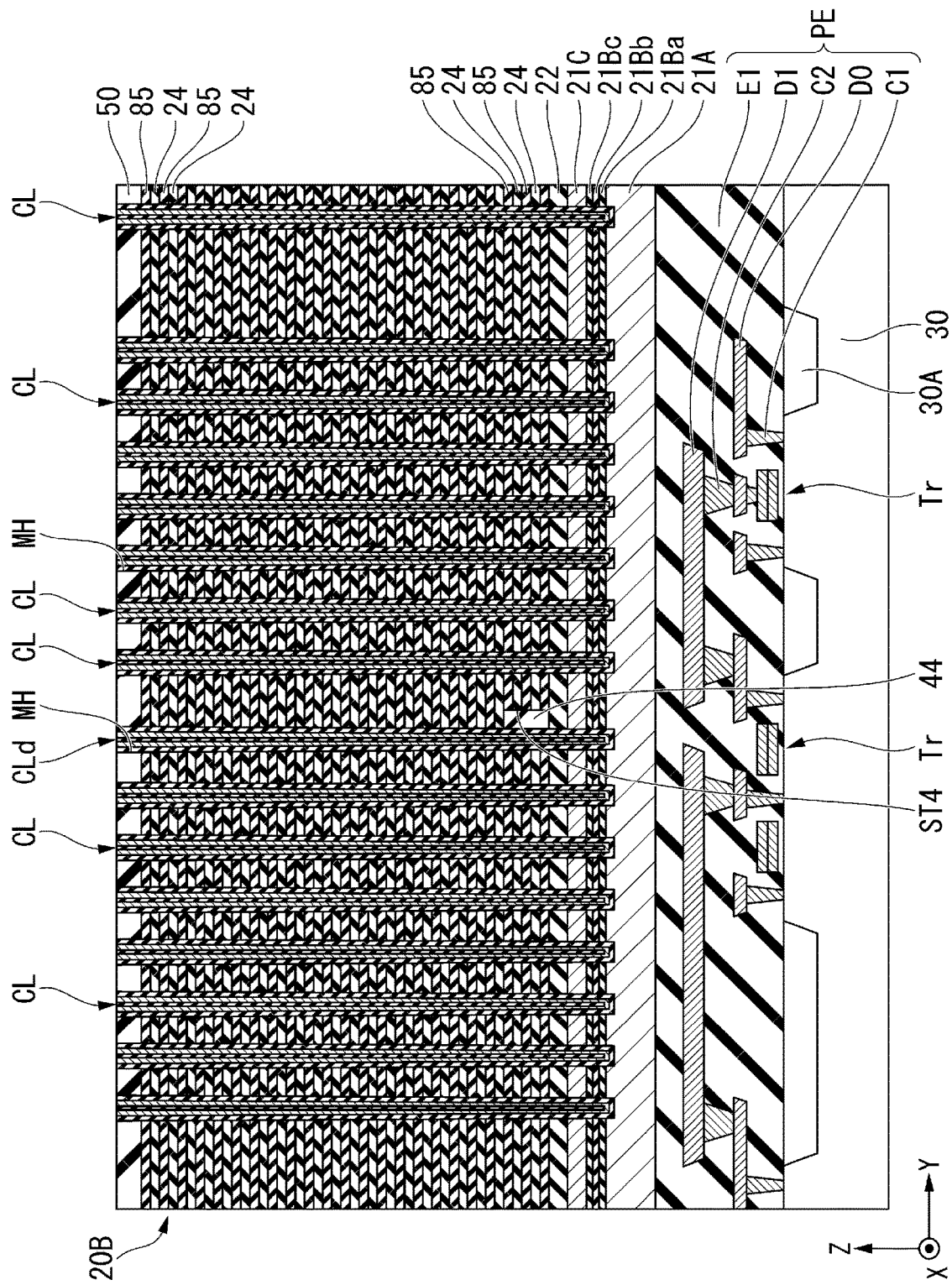

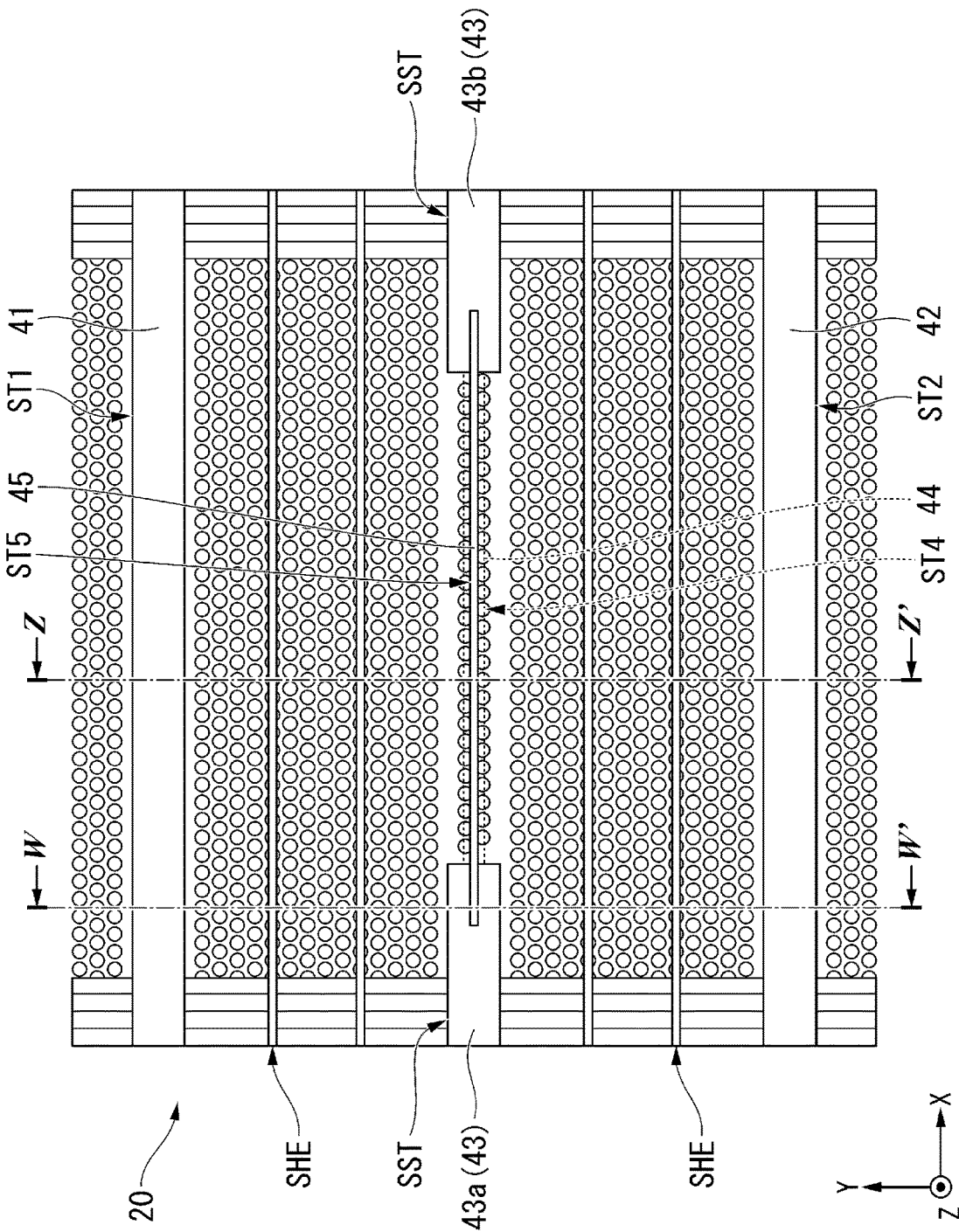

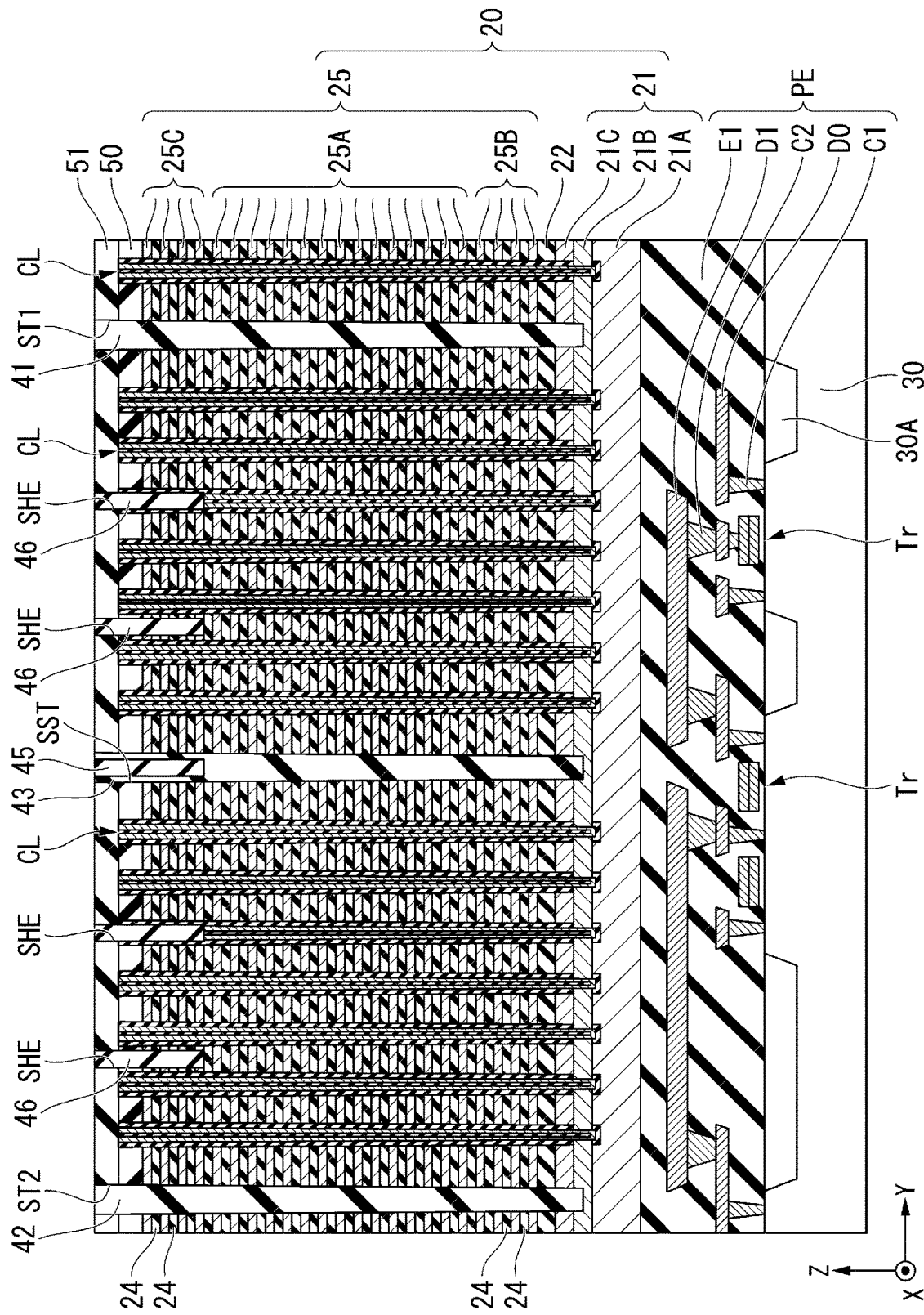

SEMICONDUCTOR STORAGE DEVICE AND METHOD OF MANUFACTURING SEMICONDUCTOR STORAGE DEVICE

CROSS-REFERENCE TO RELATED APPLICATION(S)

This application is a continuation of U.S. patent application Ser. No. 17/684,834, filed Mar. 2, 2022, which is based upon and claims the benefit of priority from Japanese Patent Application No. 2021-151000, filed Sep. 16, 2021, the entire contents of which are incorporated herein by reference.

FIELD

Embodiments described herein relate generally to a semiconductor storage device and a method of manufacturing the semiconductor storage device.

BACKGROUND

A NAND flash memory in which memory cells are stacked in a three-dimensional manner is known.

BRIEF DESCRIPTION OF THE DRAWINGS

FIG. 3C illustrates a cross-sectional view of another part of a semiconductor storage device according to a first embodiment.

FIG. 14A is a plan view diagrams to illustrate a process of a method of manufacturing a semiconductor storage device according to a first embodiment.

FIGS. 15-19 are cross-sectional diagrams to illustrate processes of a method of manufacturing a semiconductor storage device according to a first modification of a first embodiment.

FIG. 20A is a plan view diagram to illustrate a process of a method of manufacturing a semiconductor storage device according to a first modification of a first embodiment.

FIGS. 20B-20C are cross-sectional diagrams to illustrate processes of a method of manufacturing a semiconductor storage device according to a first modification of the first embodiment.

DETAILED DESCRIPTION

Figure 1:
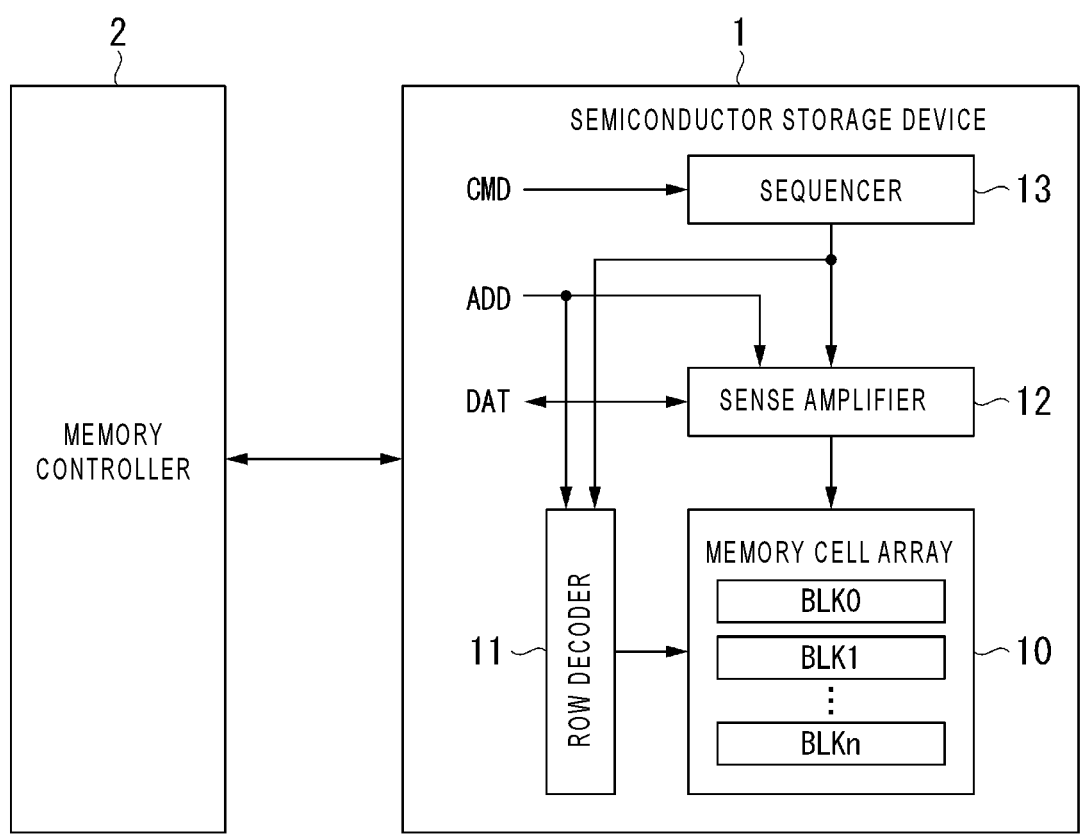
FIG. 1 is a block diagram illustrating a semiconductor storage device and a memory controller according to a first embodiment.

Embodiments provide a semiconductor storage device and a method of manufacturing a semiconductor storage device. The semiconductor storage device may have improved physical strength and performance characteristics related to data reading.

In general, according to an embodiment, a semiconductor storage device includes a stack, first columns, and first, second, third, fourth, and fifth insulators. The stack includes first conductive layers stacked in a first direction, a second conductive layer disposed below the first conductive layers, and a third conductive layer disposed above the first conductive layers. The first columns penetrate the stack in the first direction. Each of the first columns includes a semiconductor layer. The first insulator penetrates the stack in the first direction and extending in a second direction intersecting the first direction. The second insulator is provided at a position separated from the first insulator in a third direction intersecting the first and second directions, penetrates the stack in the first direction, and extends in the second direction. The third insulator is provided between the first and second insulators in the third direction, penetrates the stack in the first direction, and extends in the second direction. The third insulator includes a first portion and a second portion that are apart from each other in the second direction. The fourth insulator is provided between the first portion and the second portion, and extends in the first and second directions. The fifth insulator is provided between the first portion and the second portion above the fourth insulator, and extends in the first and second directions. The second conductive layer includes two regions electrically isolated from each other, between which the third and fourth insulators are provided. The third conductive layer includes two regions electrically isolated from each other, between which the third and fifth insulators are provided.

Hereinafter, a semiconductor storage device and a method of manufacturing the semiconductor storage device according to certain example embodiments will be described with reference to the drawings. In the following description, the same reference numerals will be given to components having the same or substantially similar functions. Duplicated description of such repeated components may be omitted. The drawings are schematic or conceptual, and a relationship between the dimensions (e.g., thicknesses and widths) of each part and the ratio of sizes between the depicted parts are not necessarily the same as actual ones. The meaning of the term "connection" in this disclosure is not limited to a case of being physically connected, but also includes a case of being electrically connected. The meaning of the terms "parallel", "orthogonal", and "the same" in this disclosure are to be taken to refer to "substantially parallel", "substantially orthogonal", and "substantially the same", unless otherwise noted.

In the following description, an X direction, a Y direction, and a Z direction will be defined for certain drawings and for purposes of explanation of relative positioning of components. The X direction and the Y direction are directions substantially parallel to the surface of a substrate 30. The X direction and the Y direction are orthogonal to each other. The Z direction is orthogonal to the X direction and the Y direction, and is a direction away from the substrate 30. It is noted that these directional expressions are merely for explanatory convenience and do not necessarily relate to the direction of gravity.

In the drawings referenced below, for example, the X direction corresponds to the direction in which a word line WL extends, the Y direction corresponds to the direction in which a bit line BL extends, and the Z direction corresponds to the direction perpendicular to the surface of the substrate 30 used for the formation of a semiconductor storage device 1. In a plan view, hatching is appropriately added to some components in order to make the drawing easier to see. The hatching added to the plan view is not necessarily related to the materials or characteristics of the components to which the hatching is added. In each of the plan view and the cross-sectional view, illustration of some components such as wirings, contacts, and interlayer insulating films is appropriately omitted in order to make the drawings easier to see.

First Embodiment

FIG. 1 is a block diagram illustrating the semiconductor storage device 1 and a memory controller 2. The semiconductor storage device 1 is a nonvolatile semiconductor storage device, and is, for example, a NAND flash memory. The semiconductor storage device 1 includes, for example, a memory cell array 10, a row decoder 11, a sense amplifier 12, and a sequencer 13.

The memory cell array 10 includes a plurality of blocks BLK0 to BLKn (n is an integer of 1 or more). Each block BLK is a set of nonvolatile memory cell transistors MT (see FIG. 2). The memory cell array 10 includes a plurality of bit lines and a plurality of word lines. Each memory cell transistor MT is connected to one bit line and one word line. A configuration of the memory cell array 10 will be described below.

The row decoder 11 selects one block BLK based on address information ADD received from the external memory controller 2. The row decoder 11 applies a predetermined voltage to each of the plurality of word lines, thereby controlling a data write operation and a data read operation with respect to the memory cell array 10.

The sense amplifier 12 applies a predetermined voltage to each bit line according to write data DAT received from the memory controller 2. The sense amplifier 12 determines data stored in the memory cell transistor MT based on the voltage of the bit line, and transmits the determined read data DAT to the memory controller 2.

The sequencer 13 controls an operation of the entire semiconductor storage device 1 based on a command CMD received from the memory controller 2.

The semiconductor storage device 1 and the memory controller 2 described above may constitute one semiconductor device by such a combination. Examples of the semiconductor device may include a memory card such as an SD® card and a solid state drive (SSD).

Next, an electrical configuration of the memory cell array 10 will be described.

Figure 2:
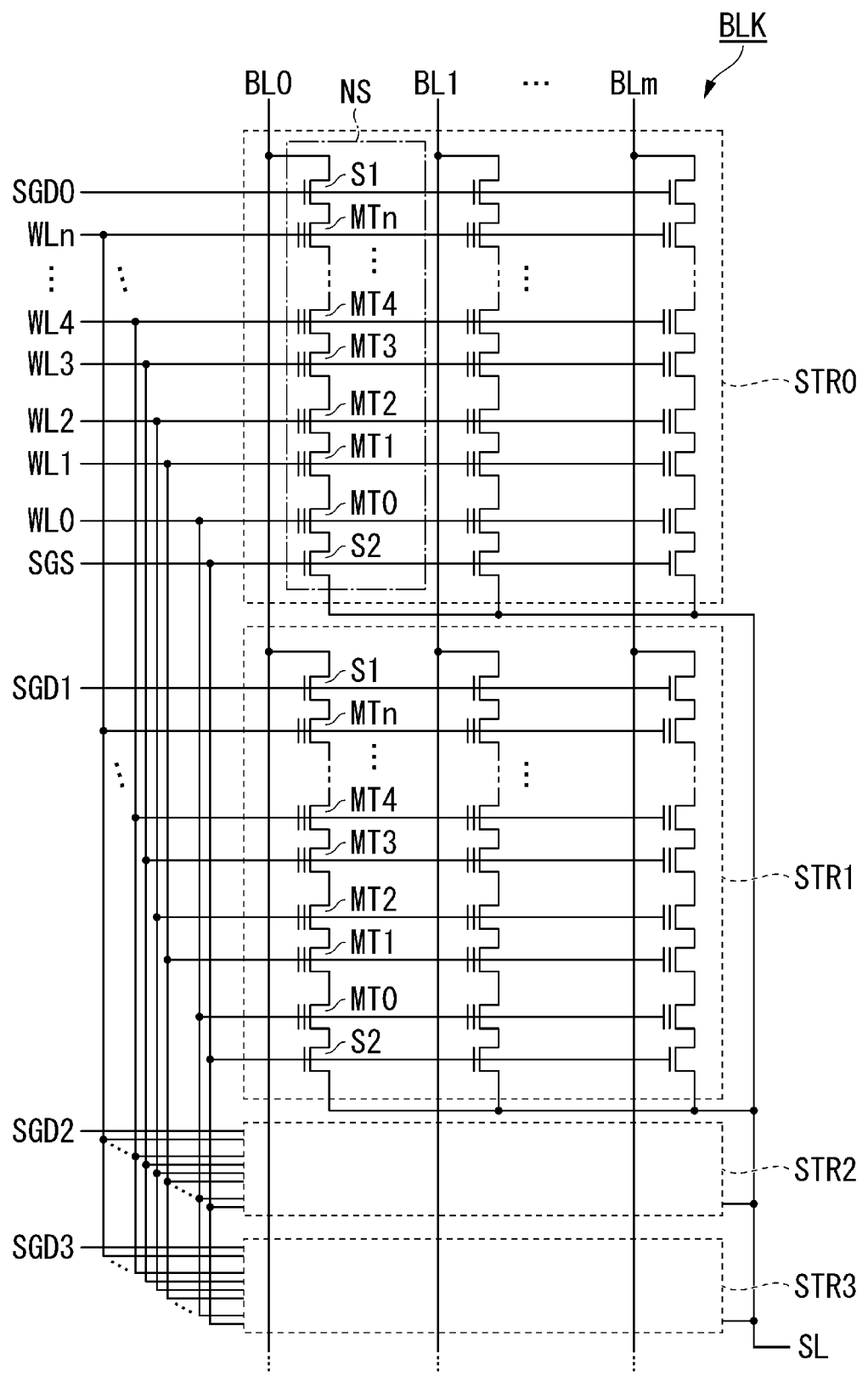
FIG. 2 is a diagram illustrating an equivalent circuit of a part of a memory cell array of a semiconductor storage device according to a first embodiment.

FIG. 2 is a diagram illustrating an equivalent circuit of a part of the memory cell array 10. FIG. 2 shows one block BLK provided in the memory cell array 10. The block BLK includes a plurality of (e.g., four) strings STR0 to STR3.

Each of the strings STR0 to STR3 is an aggregate of a plurality of NAND strings NS. One end of each NAND string NS is connected to one of bit lines BL0 to BLm (m is an integer of 1 or more). The other end of the NAND string NS is connected to a source line SL. Each NAND string NS includes a plurality of memory cell transistors MT0 to MTn (n is an integer of 1 or more), a first select transistor S1, and a second select transistor S2.

The plurality of memory cell transistors MT0 to MTn are electrically connected to each other in series. The memory cell transistor MT includes a control gate and a memory stacked film (e.g., a charge storage film), and stores data in a non-volatile manner. The memory cell transistor MT changes the state of the memory stacked film according to the voltage applied to the control gate (for example, stores electric charges in the charge storage film). The control gate of the memory cell transistor MT is connected to one of the corresponding word lines WL0 to WLn. The memory cell transistor MT is electrically connected to the row decoder 11 via the word line WL.

The first select transistor S1 in each NAND string NS is connected between the plurality of memory cell transistors MT0 to MTn and one of the bit lines BL0 to BLm. A drain of the first select transistor S1 is connected to one of the bit lines BL0 to BLm. A source of the first select transistor S1 is connected to the memory cell transistor MTn. A control gate of the first select transistor S1 in each NAND string NS is connected to one of select gate lines SGD0 to SGD3. The first select transistor S1 is electrically connected to the row decoder 11 via the select gate line SGD. The first select transistor S1 interconnects the NAND string NS and the bit line BL when a predetermined voltage is applied to one of the select gate lines SGD0 to SGD3.

The second select transistor S2 in each NAND string NS is connected between the plurality of memory cell transistors MT0 to MTn and the source line SL. A drain of the second select transistor S2 is connected to the memory cell transistor MT0. A source of the second select transistor S2 is connected to the source line SL. A control gate of the second select transistor S2 is connected to a select gate line SGS. The second select transistor S2 is electrically connected to the row decoder 11 via the select gate line SGS. The second select transistor S2 interconnects the NAND string NS and the source line SL when a predetermined voltage is applied to the select gate line SGS.

The memory cell array 10 may have a circuit configuration other than that described above. For example, the number of respective strings STR provided in each block BLK, the number of memory cell transistors MT provided in each NAND string NS, and the number of select transistors STD and STS may be changed. Further, the NAND string NS may include one or more dummy transistors.

Figure 3A:
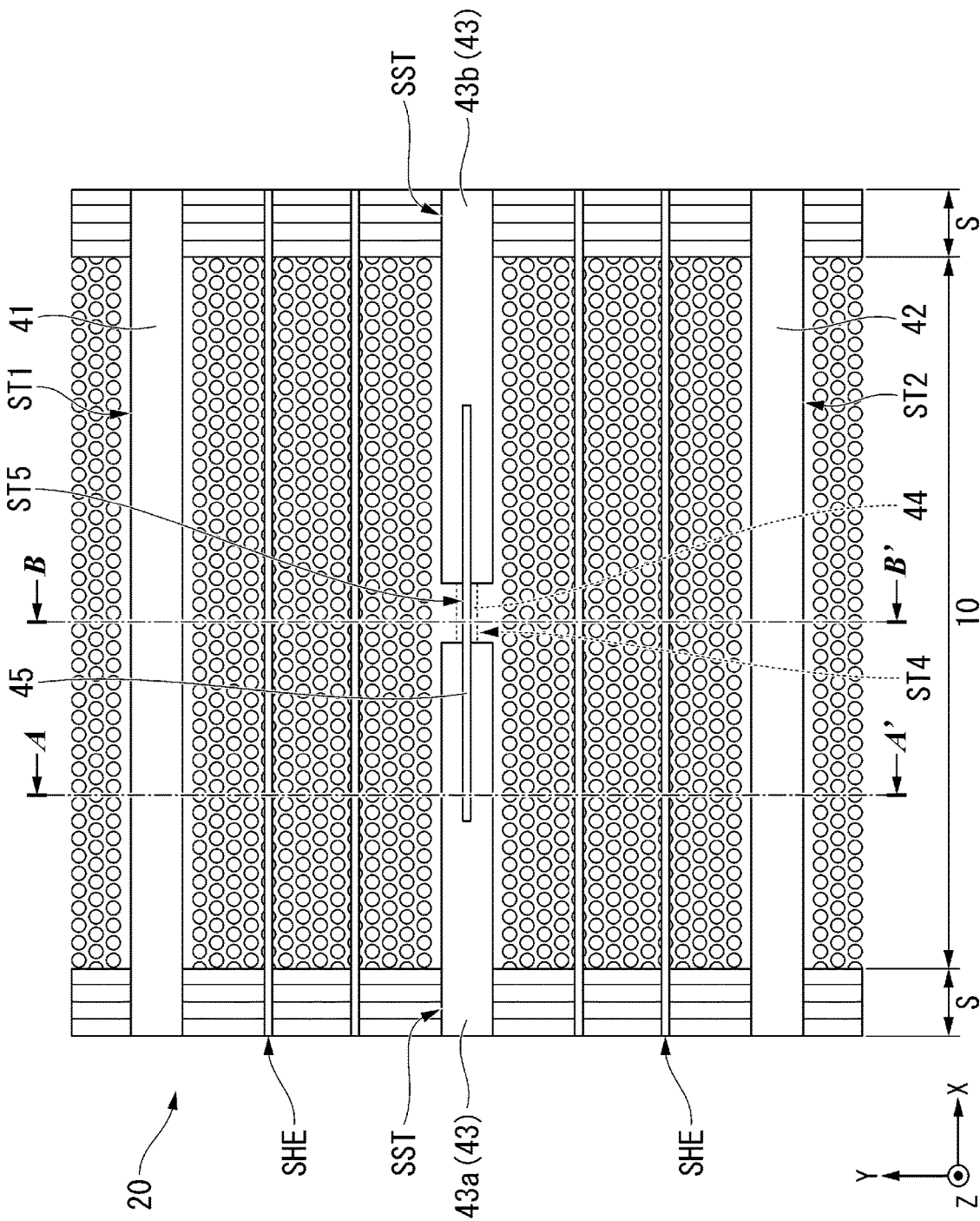
FIG. 3A illustrates a plan view of a part of a semiconductor storage device according to a first embodiment.
Figure 3B:
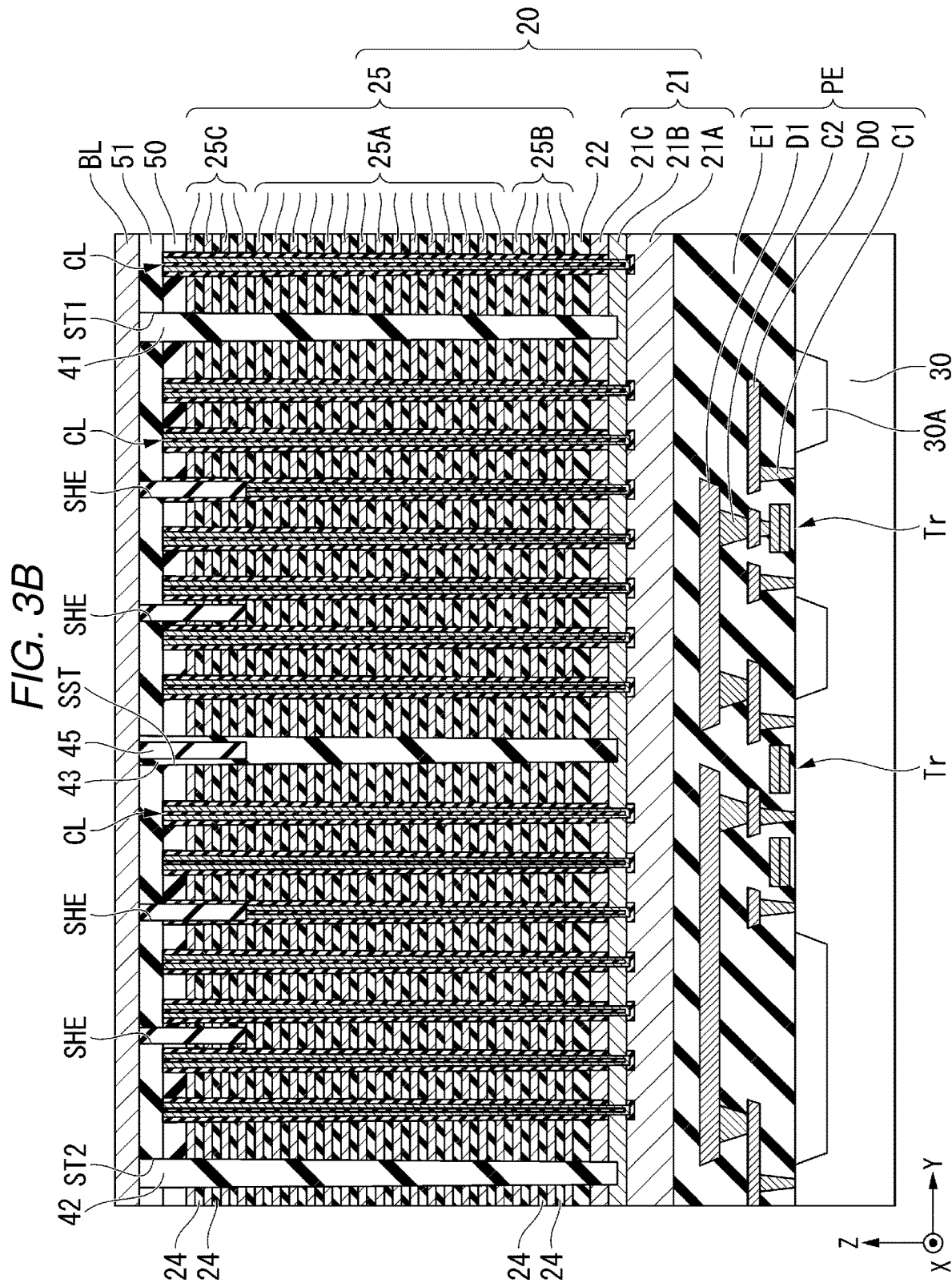
FIG. 3B illustrates a cross-sectional view of a part of a semiconductor storage device according to a first embodiment.

FIG. 3A illustrates a plan view of a part of the semiconductor storage device 1 according to a first embodiment. FIG. 3B illustrates a cross-sectional view of the semiconductor storage device 1 taken along the A-A' plane in FIG. 3A. FIG. 3C illustrates a cross-sectional view of the semiconductor storage device 1 taken along the B-B' plane in FIG. 3A.

As illustrated in FIG. 3A, the semiconductor storage device 1 according to the first embodiment includes the memory cell array 10 and, for example, stepped portions S provided at both ends of a stack 20 in the X direction. A first slit ST1 and a second slit ST2 are provided from one stepped portion S of the stack 20 to the other stepped portion S through the memory cell array 10. Similarly, a third slit SST and a sixth slit SHE are also provided from one stepped portion S of the stack 20 to the other stepped portion S through the memory cell array 10.

Next, an example of the structure of the memory cell array 10 of the semiconductor storage device 1 will be described. The memory cell array 10 has a cell array area and a peripheral area. In the cell array area, the NAND strings NS are integrated. In the peripheral area, a peripheral circuit which controls the cell array area is disposed. The peripheral area may be adjacent to the cell array area in the X direction or in the Y direction, or may be stacked in the Z direction with respect to the cell array area. Hereinafter, an example in which the peripheral area is stacked in the Z direction with respect to the cell array area will be illustrated.

As illustrated in FIGS. 3A and 3B, the memory cell array 10 of the semiconductor storage device 1 includes the substrate 30, a circuit layer PE, the stack 20, a plurality of columnar bodies CL, a first insulator 41, a second insulator 42, a third insulator 43, a fourth insulator 44, and a fifth insulator 45. In the present embodiment, the columnar body CL is an example of a "first columnar body" or "first column".

The substrate 30 is, for example, a silicon substrate. A plurality of element isolation regions 30A is present in a surface region of the substrate 30. The element isolation region 30A contains, for example, a silicon oxide. A source region and a drain region of the transistor Tr are present between the adjacent element isolation regions 30A.

The circuit layer PE is on the substrate 30. The circuit layer PE includes the row decoder 11, the sense amplifier 12, and the sequencer 13 of the semiconductor storage device 1. The circuit layer PE includes, for example, a plurality of transistors Tr, a plurality of wiring layers D0 and D1, and a plurality of vias C1 and C2. The plurality of transistors Tr, the plurality of wiring layers D0 and D1, and the plurality of vias C1 and C2 are formed in an insulating layer E1. The insulating layer E1 contains, for example, a silicon oxide. The via C1 interconnects the source region or the drain region of the transistor Tr and the wiring layer D0. The via C2 interconnects a gate region of the transistor Tr and the wiring layer D1. Each of the wiring layer D0 and the wiring layer D1 extends in the X direction and the Y direction. The wiring layer D1 is connected to a contact plug CP1. The vias C1 and C2 and the wiring layers D0 and D1 contain, for example, tungsten.

The stack 20 includes a conductive layer 21, a plurality of conductive layers 25, an insulating layer 22, and a plurality of insulating layers 24 in the Z direction. The conductive layers 21 and 25 and the insulating layers 22 and 24 are alternately stacked. The plurality of conductive layers 21 and 25 extend in the X direction and the Y direction. The plurality of insulating layers 22 and 24 extend in the X direction and the Y direction. The plurality of insulating layers 24 and the plurality of conductive layers 25 are alternately stacked one by one in the Z direction.

The insulating layer 22 and the plurality of insulating layers 24 extend in the X direction and the Y direction. The insulating layer 22 and the plurality of insulating layers 24 contain, for example, a silicon oxide. The insulating layer 22 is between the conductive layer 21 and the conductive layer 25. Each insulating layer 24 is between two conductive layers 25 adjacent to each other in the Z direction. Each insulating layer 24 insulates between the two conductive layers 25 adjacent to each other in the Z direction. The number of insulating layers 24 is determined based on the number of conductive layers 25.

The plurality of conductive layers 25 extend in the X direction and the Y direction. That is, each conductive layer 25 is formed in a plate shape extending along the X direction and the Y direction. The conductive layer 25 is, for example, tungsten or polysilicon doped with impurities. The number of conductive layers 25 may be freely chosen.

The plurality of conductive layers 25 include a plurality of first conductive layers 25A stacked in the Z direction, a second conductive layer 25B located between the substrate 30 and the plurality of first conductive layers 25A in the Z direction, and a third conductive layer 25C located at the side of the plurality of first conductive layers 25A opposite to the substrate 30 in the Z direction. The plurality of conductive layers 25 are functionally divided into, for example, three parts. Each conductive layer 25 functions as one of the select gate line SGS on the source side, the word line WL, and the select gate line SGD on the drain side.

Among the conductive layers 25, at least one second conductive layer 25B from the bottom of the stack 20 functions as the select gate line on the source side (the source-side select gate line) SGS. The at least one second conductive layer 25B functioning as the source-side select gate line SGS may be a single layer or a plurality of layers. That is, the source-side select gate line SGS may be implemented by a single conductive layer 25B or may be implemented by a plurality of conductive layers 25B. Further, when the source-side select gate line SGS is implemented by a plurality of layers, each of the conductive layers 25 may be implemented by different conductors from each other.

Among the conductive layers 25, at least one third conductive layer 25C from the top of the stack 20 functions as the select gate line on the drain side (the drain-side select gate line) SGD. The at least one third conductive layer 25C functioning as the drain-side select gate line SGD may be a single layer or a plurality of layers. That is, the drain-side select gate line SGD may be implemented by a single third conductive layer 25C or may be implemented by a plurality of third conductive layers 25C. Further, when the drain-side select gate line SGD is implemented by a plurality of layers, each of the third conductive layers 25C may be implemented by different conductors from each other.

Among the conductive layers 25, the conductive layers 25 other than the source-side select gate line SGS and the drain-side select gate line SGD functions as the word line WLs. The conductive layers 25 functioning as the word line WLs surround, for example, the outer periphery of the columnar body CL.

The plurality of conductive layers 25 contain, for example, a conductive metal. The conductive metal is, for example, tungsten. The plurality of conductive layers 25 may be, for example, polysilicon doped with impurities.

The conductive layer 21 is disposed on top of the circuit layer PE. The conductive layer 21 includes semiconductor layers 21A, 21B, and 21C. The semiconductor layer 21A is on the circuit layer PE. The semiconductor layer 21B is on the semiconductor layer 21A. The semiconductor layer 21C is on the semiconductor layer 21B. The details of the semiconductor layers 21A, 21B, and 21C will be described below.

A cover insulating layer 50 is present on the insulating layer 24 as an uppermost layer of the stack 20. The cover insulating layer 50 insulates between the stack 20 and the bit line BL. The cover insulating layer 50 contains, for example, a silicon oxide.

The bit line BL is formed on the cover insulating layer 50, for example, in a line shape extending in the Y direction, and is electrically connected to one columnar body CL and a contact plug. A plurality of bit lines BL is arranged in the X direction.

The plurality of columnar bodies CL are provided in the stack 20. The plurality of columnar bodies CL extend in the Z direction. Each of the plurality of columnar bodies CL penetrates the stack 20, for example, in the Z direction. The bottom of the columnar body CL is in contact with the semiconductor layer 21A. The top of the columnar body CL is in contact with the cover insulating layer 50.

Figure 4A:
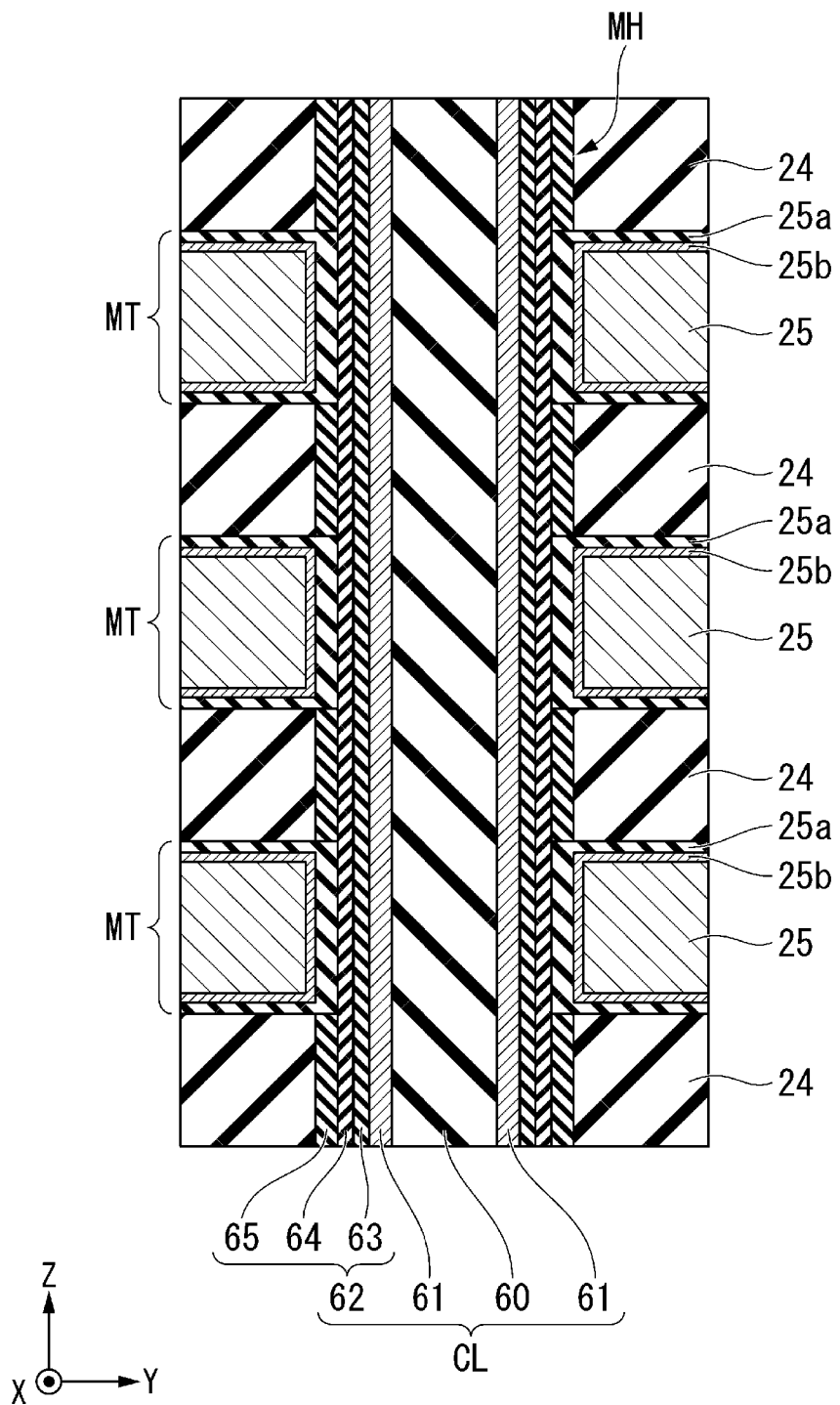
FIG. 4A illustrates a cross-sectional view of a columnar body of a semiconductor storage device according to a first embodiment.
Figure 4B:
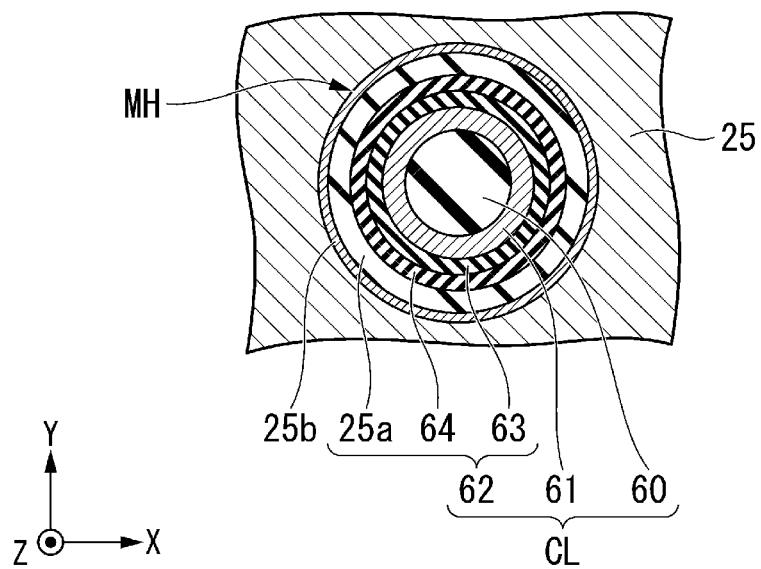
FIG. 4B illustrates another cross-sectional view of a columnar body of a semiconductor storage device according to a first embodiment.

FIG. 4A illustrates an enlarged cross-sectional view of the vicinity of the columnar body CL of the semiconductor storage device 1. FIG. 4B illustrates a cross-sectional view of the vicinity of the columnar body CL of the semiconductor storage device 1 taken along the conductive layer 25. FIG. 4A illustrates a cross section of the columnar body CL taken along the YZ plane, and FIG. 4B illustrates a cross section of the columnar body CL taken along the XY plane. Each of the plurality of columnar bodies CL is formed in a memory hole MH, and includes an insulating core 60, a semiconductor layer 61, and a memory stacked film 62 in this order from the inside.

The insulating core 60 extends in the Z direction and has a columnar shape. The insulating core 60 contains, for example, a silicon oxide. The insulating core 60 is provided in a central portion including the center axis of the memory hole MH when viewed from the Z direction.

The semiconductor layer 61 extends in the Z direction. The semiconductor layer 61 is formed, for example, in an annular shape, and covers the outer surface (e.g., outer peripheral surface) of the insulating core 60. The semiconductor layer 61 contains, for example, silicon. Silicon is, for example, polysilicon obtained by crystallizing amorphous silicon. The semiconductor layer 61 functions as a channel of each of the first select transistor S1, the plurality of memory cell transistors MT, and the second select transistor S2. The "channel" as used herein is a carrier flow path between the source side and the drain side.

The memory stacked film 62 extends in the Z direction. The memory stacked film 62 covers the outer surface (e.g., outer peripheral surface) of the semiconductor layer 61. The memory stacked film 62 is between the inner surface (inner peripheral surface) of the memory hole MH and the outer surface (outer peripheral surface) of the semiconductor layer 61. The memory stacked film 62 includes, for example, a tunnel insulating film 63, a charge storage film 64, and a cover insulating film 65. Such a plurality of films is provided in the order of the tunnel insulating film 63, the charge storage film 64, and the cover insulating film 65 from the semiconductor layer 61 side.

The tunnel insulating film 63 covers the outer surface of the semiconductor layer 61. That is, the tunnel insulating film 63 is located between the charge storage film 64 and the semiconductor layer 61. The tunnel insulating film 63 contains, for example, a silicon oxide, or a silicon oxide and a silicon nitride. The tunnel insulating film 63 is a potential barrier between the semiconductor layer 61 and the charge storage film 64.

The charge storage film 64 covers the outer surface of the tunnel insulating film 63. That is, the charge storage film 64 is located between each conductive layer 25 and the tunnel insulating film 63. The charge storage film 64 contains, for example, a silicon nitride. Portions where the charge storage film 64 and the plurality of conductive layers 25 intersect each other function as transistors, respectively. The memory cell transistor MT stores data according to presence or absence of electric charges in the portion (e.g., charge storage portion) where the charge storage film 64 intersects each of the plurality of conductive layers 25, or according to the amount of stored electric charges. The charge storage portion is between each conductive layer 25 and the semiconductor layer 61 and is surrounded by an insulating material. The charge storage portion has a so-called floating gate structure.

The cover insulating film 65 is located, for example, between each insulating layer 24 and the charge storage film 64, as illustrated in FIG. 4A. The cover insulating film 65 contains, for example, a silicon oxide. The cover insulating film 65 protects the charge storage film 64 from etching during a processing. The cover insulating film 65 may be omitted, and a part thereof may remain between the conductive layer 25 and the charge storage film 64 and may be used as a block insulating film.

Further, a block insulating film 25a and a barrier film 25b may be provided between each conductive layer 25 and each insulating layer 24 and between each conductive layer 25 and the memory stacked film 62. The block insulating film 25a reduces back tunneling. Back tunneling is a phenomenon in which electric charges return from the conductive layer 25 to the memory stacked film 62. The barrier film 25b improves adhesion between the conductive layer 25 and the block insulating film 25a. The block insulating film 25a is, for example, a silicon oxide film or a metal oxide film. An example of a metal oxide is an aluminum oxide. For example, when the conductive layer 25 is tungsten, the barrier film 25b is, for example, a stacked structure film of titanium nitride and titanium.

Figure 4C:
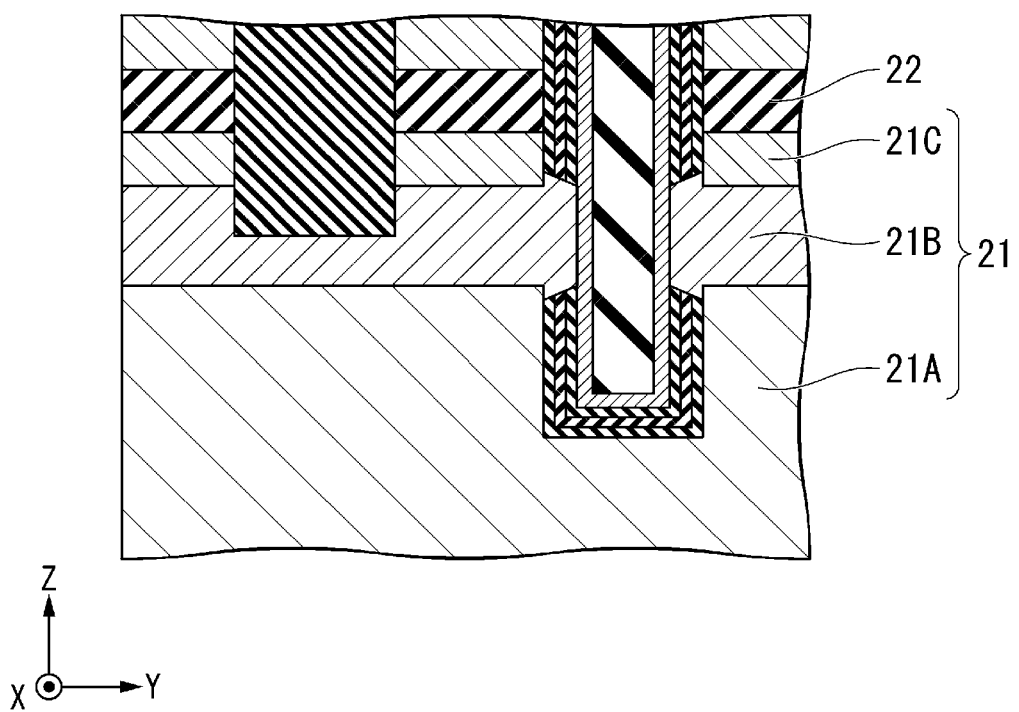
FIG. 4C illustrates an enlarged cross-sectional view of a vicinity of a conductive layer of a semiconductor storage device according to a first embodiment.

FIG. 4C illustrates an enlarged cross-sectional view of the vicinity of the conductive layer 21 of the semiconductor storage device 1. FIG. 4C illustrates a cross section of the conductive layer 21 and the columnar body CL taken along the YZ plane. The conductive layer 21 includes, for example, the semiconductor layer 21A, the semiconductor layer 21B, and the semiconductor layer 21C as described above. The conductive layer 21 is connected to each of the plurality of columnar bodies CL. The conductive layer 21 is formed, for example, in a plate shape extending along the X direction and the Y direction, and functions as the source line SL.

The semiconductor layer 21A is on the circuit layer PE. The semiconductor layer 21A is, for example, an n-type semiconductor. The semiconductor layer 21A is, for example, polysilicon doped with impurities. The semiconductor layer 21B is on the semiconductor layer 21A. The semiconductor layer 21B is in contact with the semiconductor layer 61 of the columnar body CL. The semiconductor layer 21B is, for example, an epitaxial film doped with impurities. The semiconductor layer 21B contains, for example, phosphorus. The semiconductor layer 21C is on the semiconductor layer 21B. The semiconductor layer 21C is, for example, an n-type or undoped semiconductor.

Here, the semiconductor storage device 1 according to the present embodiment has a plurality of slits (see first to fifth slits below) in a plan view from the Z direction, as illustrated in FIG. 3A. The plurality of slits are grooves dividing the stack 20 in the Y direction. All of the plurality of slits extend in the X direction.

The plurality of slits include the first slit ST1, the second slit ST2, the third slit SST, a fourth slit ST4, a fifth slit ST5, and the sixth slit SHE.

The first slit ST1 and the second slit ST2 are both deep slits, and penetrate the stack 20 to reach the conductive layer 21 from the upper surface of the cover insulating layer 50.

The second slit ST2 is disposed at a position separated from the first slit ST1 in the Y direction.

The third slit SST is a deep slit, and penetrates the stack 20 to reach the conductive layer 21 from the upper surface of the cover insulating layer 50. The third slit SST extends in the X direction in a plan view from the Z direction, and is provided in a broken line shape.

The fourth slit ST4 is provided between the third slits SST adjacent to each other in the X direction at a position corresponding to the second conductive layer 25B (the source-side select gate line SGS) in the stack 20, and divides the second conductive layer 25B in the Y direction.

The fifth slit ST5 is provided at a position corresponding to the third conductive layer 25C (the drain-side select gate line SGD) in the stack 20, and divides the third conductive layer 25C in the Y direction. The fifth slit ST5 extends in the X direction in a plan view from the Z direction and spans between the third slits SST adjacent to each other in the X direction. The sixth slit SHE is a shallow slit, and is provided from the upper surface of the cover insulating layer 50 to the middle of the stack.

The first insulator 41 and the second insulator 42 are provided in the first slit ST1 and the second slit ST2, respectively. That is, each of the first insulator 41 and the second insulator 42 is provided in the stack 20 from the upper surface of the cover insulating layer 50 to the conductive layer 21 along the Z direction. The first insulator 41 extends along the X direction in a plan view from the Z direction, and the second insulator 42 extends along the X direction at a position different from that of the first insulator 41 in the Y direction. The first conductive layer 25A, the second conductive layer 25B, and the third conductive layer 25C are divided in the Y direction by the first insulator 41 and the second insulator 42. Each of the first insulator 41 and the second insulator 42 contains, for example, a silicon oxide. The stack 20 between the first insulator 41 and the second insulator 42 is called a "block" and constitutes, for example, a minimum unit of data erasing.

The third insulator 43 is provided in the deep third slit SST provided in a broken line shape in a plan view. That is, the third insulator 43 includes a plurality of insulators 43a and 43b separated from each other in the X direction between the first insulator 41 and the second insulator 42 in the Y direction. The insulator 43a mentioned here is an example of a first portion, and the insulator 43b is an example of a second portion. Further, the third insulator 43 is provided in the stack 20 from the upper surface of the cover insulating layer 50 to the conductive layer 21 along the Z direction, and is provided in a broken line shape with respect to the X direction. The third insulator 43 contains, for example, a silicon oxide.

The fourth insulator 44 is provided in the fourth slit ST4 provided at a position corresponding to the second conductive layer 25B (the source-side select gate line SGS). That is, the fourth insulator 44 extends in the Z direction and the X direction between the third slits SST adjacent to each other in the X direction (e.g., between the insulators 43a and 43b) in a lower region of the stack 20 on the substrate 30 side. The second conductive layer 25B is divided in the Y direction by the fourth insulator 44. The fourth insulator 44 may be in contact with the ends of the insulators 43a and 43b. Further, the fourth insulator 44 is disposed at a position overlapping with the fifth insulator 45 (described below) in a plan view from the Z direction.

The fifth insulator 45 is provided in the fifth slit ST5 at a position corresponding to the third conductive layer 25C (e.g., the drain-side select gate line SGD). That is, the fifth insulator 45 spans between the third slits SST adjacent to each other in the X direction (e.g., between the insulators 43a and 43b) in an upper region of the stack 20 on the bit line BL side. In addition, in FIG. 3A, although both ends of the fifth insulator 45 in the X direction are provided at positions where they overlap with the third insulator 43 (the insulators 43a and 43b) in the Z direction, both ends of the fifth insulator 45 in the X direction may be in contact with the ends of the insulators 43a and 43b. Further, the fifth insulator 45 extends in the Z direction and the X direction in the upper region of the stack 20 on the bit line BL side. The third conductive layer 25C is divided in the Y direction by the fifth insulator 45. Further, the fifth insulator 45 is disposed at a position overlapping with the fourth insulator 44 in a plan view from the Z direction.

The width of each of the fourth insulator 44 and the fifth insulator 45 in the Y direction may be equal to or less than the width of the third insulator (the third slit SST) in the Y direction. Although described in detail below, the third slit SST is formed after the fourth insulator 44 and the fifth insulator 45 are formed. Therefore, by setting the width of each of the fourth insulator 44 and the fifth insulator 45 in the Y direction to be equal to or less than the width of the third insulator (the third slit SST) in the Y direction, the fourth insulator 44 and the fifth insulator 45 corresponding to a position where the third slit SST is formed may be removed. As a result, a replacement processing using the third slit SST may be more stably performed.

Further, the larger the distance (interval) between the third slits SST adjacent to each other in the X direction (e.g., between the insulators 43a and 43b), the more the finger may be prevented from twisting. However, if that distance is excessively large, there is a risk of bending of the stack 20 during the replacement processing. To address such an issue, the distance (interval) between the third slits SST adjacent to each other in the X direction (e.g., between the insulators 43a and 43b) may be set within a range that may prevent the bending of the stack 20 during the replacement processing.

Further, the fourth insulator 44 and the fifth insulator 45 are provided at positions corresponding to the second conductive layer 25B (e.g., the source-side select gate line SGS) and the third conductive layer 25C (e.g., the drain-side select gate line SGD), respectively. On the other hand, the first conductive layer 25A (e.g., the word line WL) between the fourth insulator 44 and the fifth insulator 45 in the Z direction extends in the Y direction from the first insulator 41 to the second insulator 42. That is, the second conductive layer 25B and the third conductive layer 25C between the third slits SST (e.g., between the insulators 43a and 43b) are divided, but the first conductive layer 25A (e.g., the word line WL) is not divided and is continuously connected between the first insulator 41 and the second insulator 42.

The sixth insulator 46 is provided in the sixth slit SHE. The sixth insulator 46 is provided from the upper end of the stack 20 to the middle of the stack 20 along the Z direction.

As described above, the fifth insulator 45 provided in the middle of the stack 20 penetrates the third conductive layer 25C forming the drain-side select gate line SGD in the upper region of the stack 20. In the stack 20 between the first insulator 41 and the second insulator 42 which forms one block, the third conductive layer 25C forming the drain-side select gate line SGD is divided into two parts spaced apart from each other in the Y direction with the third insulator 43 (the third slit SST) therebetween.

In the present embodiment, in a plan view from the Z direction, a region between the first insulator 41 and the second insulator 42 is referred to as a "block BLK", a region between the first insulator 41 and the third insulator 43 and a region between the second insulator 42 and the third insulator 43 are referred to as "fingers F", and a region delimited by the first insulator 41 and the sixth insulator 46 adjacent to each other, by the third insulator 43 and the sixth insulator 46 adjacent to each other, or by two sixth insulators 46 adjacent to each other is referred to as a "string STR".

In the present embodiment, since two drain-side select gate lines SGD are formed by being divided by the third insulator 43 for two fingers F, each finger F in the block BLK may be set to a selected state by its corresponding drain-side select gate line SGD during data write and read. The number of strings STR provided in one finger F does not matter, but the number of strings STR is, for example, an odd number.

Further, as illustrated in FIG. 3A, the plurality of columnar bodies CL are arranged, for example, in a zigzag shape in the Y direction in a plan view from the Z direction. The number of columnar bodies CL arranged in a zigzag shape in the Y direction in each string STR is, for example, the same. In each string STR illustrated in FIG. 3A, four columnar bodies CL are arranged in a zigzag shape in the Y direction. The sixth slit SHE is formed by removing at least a part of the columnar body CL at a corresponding position by etching. Therefore, the columnar body CL formed at the position corresponding to the sixth slit SHE may have a shape in which a part thereof is cut out in a plan view.

Meanwhile, the planar layout of the memory cell array of the semiconductor storage device 1 is not limited to the layout illustrated in FIG. 3A, and may be any other layout. For example, the number and arrangement of columnar bodies CL adjacent to each other in one string STR may be appropriately changed.

The semiconductor storage device 1 according to the first embodiment can achieve improvement in the physical strength thereof against the twisting of the finger F by the third insulator 43 (the insulators 43a and 43b) arranged in a broken line shape. Furthermore, the fourth insulator 44 and the fifth insulator 45 are provided between the third insulators 43 (the insulators 43a and 43b) adjacent to each other in the X direction so as to divide the second conductive layer 25B (e.g., the source-side select gate line SGS) and the third conductive layer 25C (e.g., the drain-side select gate line SGD). Thus, during data write and read, one finger F in the block BLK may be set to a selected state, and the other finger F in the block BLK may be set to an unselected state. Then, since the string STR in the finger F in the unselected state (a finger F that is not being read) becomes a floating state, when a voltage is applied to the first conductive layer 25A (WL), the string STR is also concomitantly boosted, so that the potential difference between the string STR and the first conductive layer 25A (WL) may be maintained. As a result, influence on a read voltage of the string STR in the unselected state may be avoided, and read disturbance may be improved.

Further, in the semiconductor storage device 1 according to the first embodiment, the fourth insulator 44 dividing the second conductive layer 25B (e.g., the source-side select gate line SGS) is provided in an inner region of the block BLK (i.e., the region surrounded by the first insulator 41 and the second insulator 42) other than dividing portions of the block BLK (i.e., the first insulator 41 and the second insulator 42). Furthermore, the third insulator 43 penetrating the stack 20 is provided on each of both sides of the fourth insulator 44 in the X direction. Thus, the strength (particularly, bending strength) of the entire block BLK may be ensured and the influence of read disturbance of the adjacent fingers F divided by the fourth insulator 44 may be reduced.

The term "read disturbance" as used herein means that, during a data read operation, an electric field is generated in a memory cell (hereinafter referred to as a "non-read target memory cell") different from a data read target memory cell, and the amount of charges stored in the non-read target memory cell is changed (for example, the charges increase) by the influence of the electric field.

First Modification

A first modification of the semiconductor storage device 1 of the first embodiment will be described.

Figure 5A:
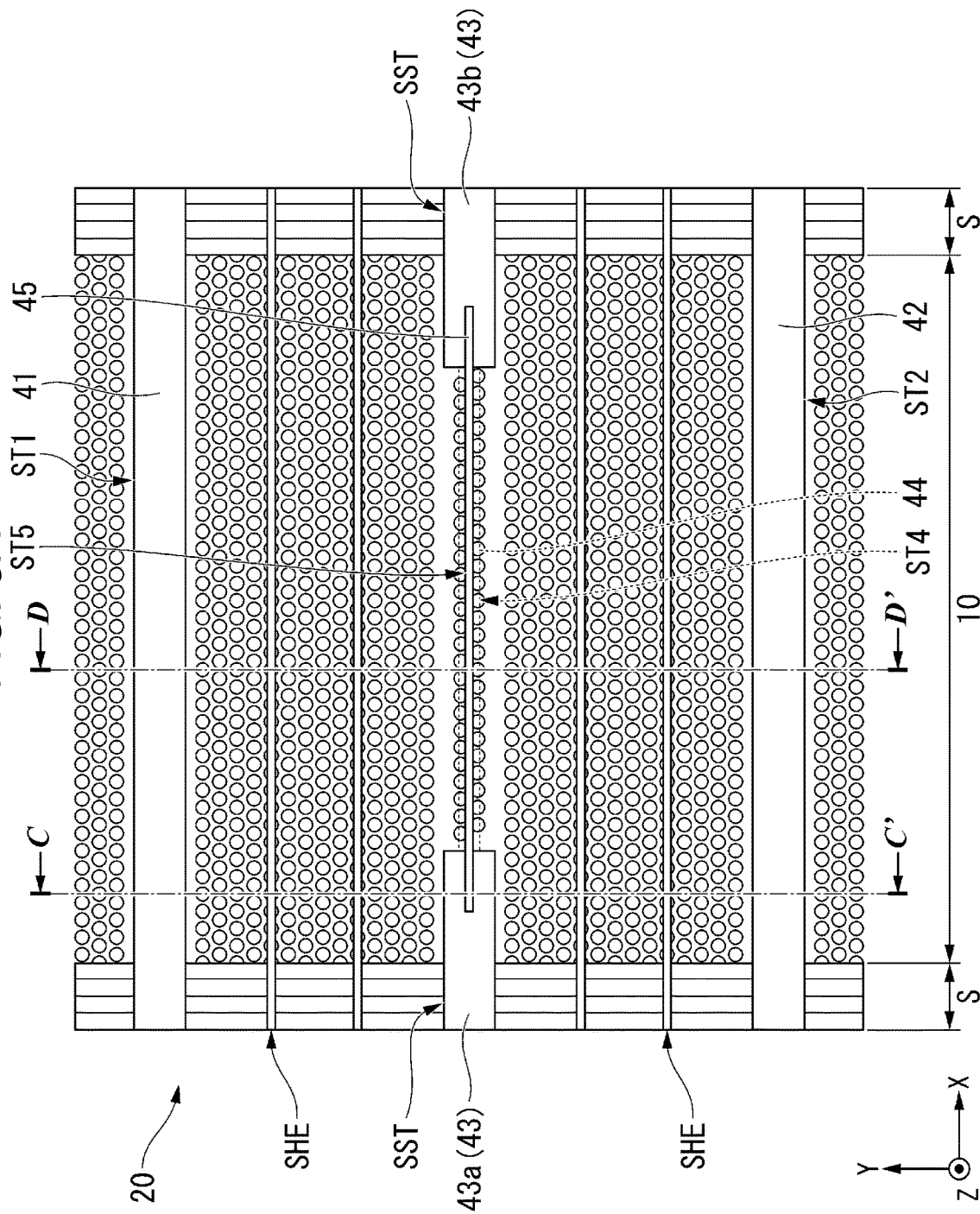
FIG. 5A illustrates a plan view of a part of a semiconductor storage device according to a first modification of a first embodiment.
Figure 5B:
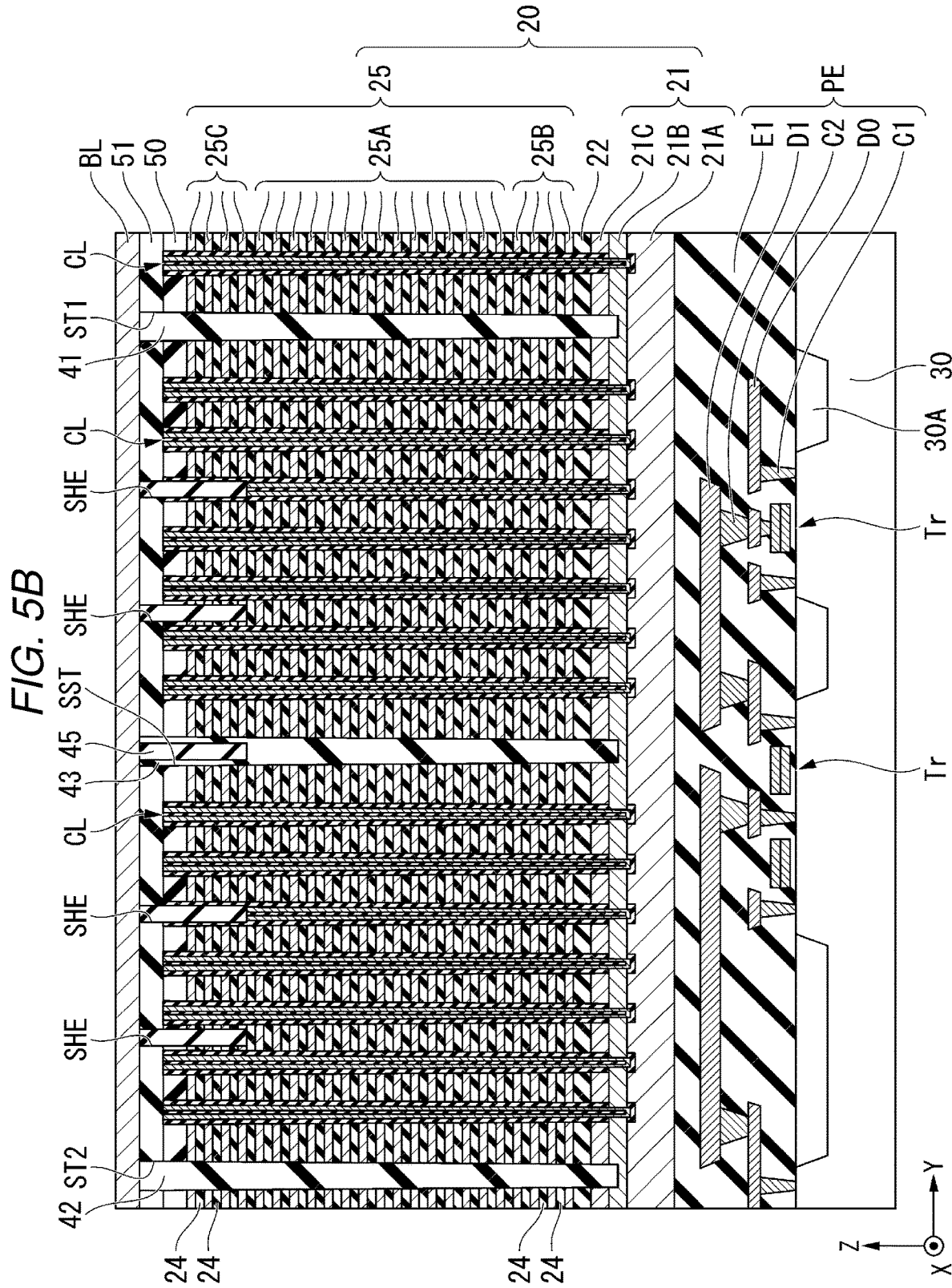
FIG. 5B illustrates a cross-sectional view of a part of a semiconductor storage device according to a first modification of a first embodiment.
Figure 5C:
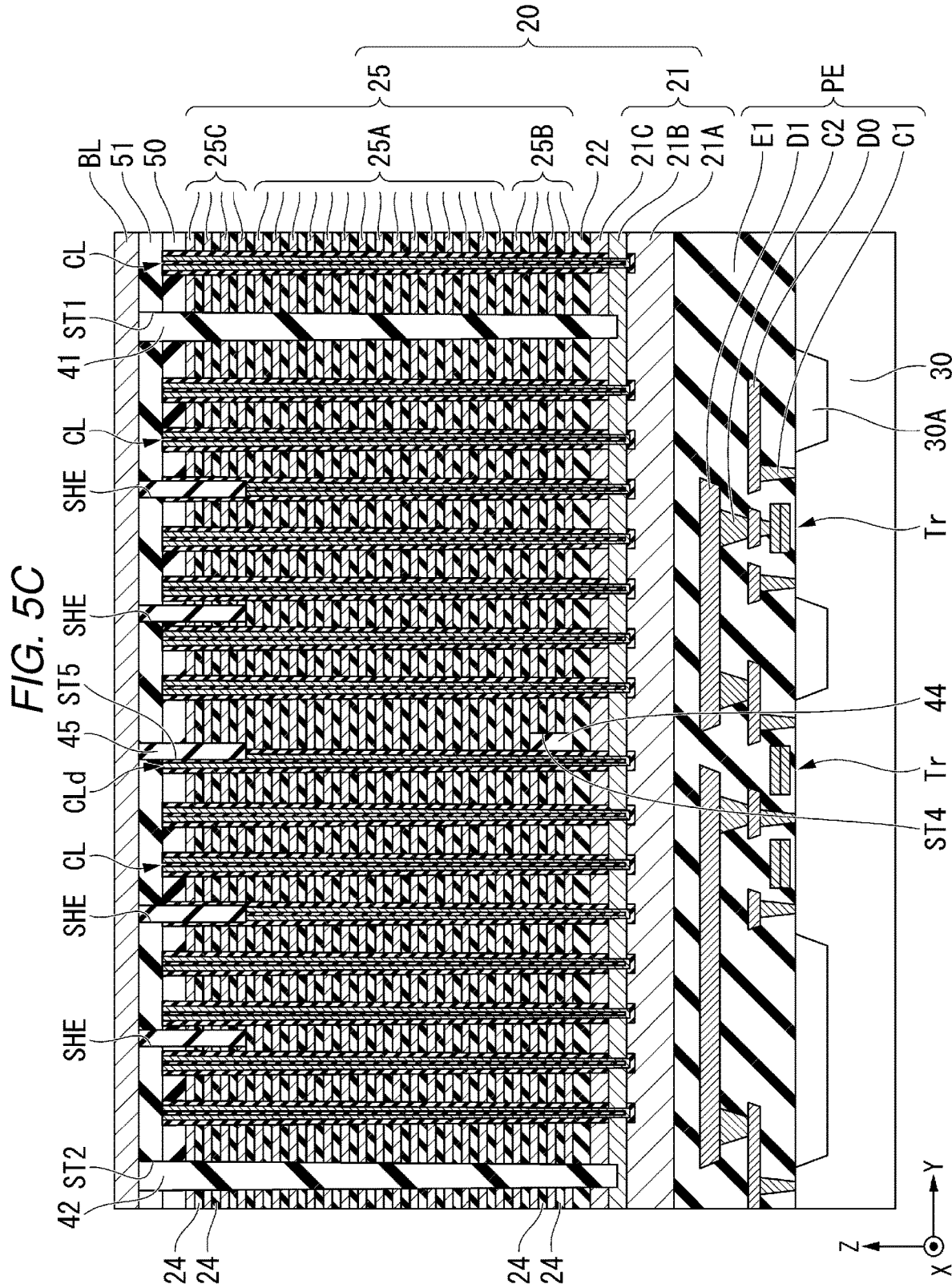
FIG. 5C illustrates a cross-sectional view of another part of a semiconductor storage device according to a first modification of a first embodiment.

FIGS. 5A to 5C illustrate cross-sectional views of a part of a semiconductor storage device 1A according to a first modification. The semiconductor storage device 1A according to the first modification has the same configuration as that of the semiconductor storage device 1 according to the first embodiment except for a configuration described below.

The semiconductor storage device 1A according to the first modification may include a plurality of second columnar bodies CLd penetrating the stack 20 in the first direction between the third insulators 43 adjacent to each other in the X-direction (between the insulators 43a and 43b). That is, in the first modification, in the stack 20 between the third insulators 43 adjacent to each other in the X direction (that is, between the insulators 43a and 43b), the plurality of second columnar bodies CLd are provided in addition to the fourth insulator 44 and the fifth insulator 45.

As described above, the larger the distance (interval) between the third insulators 43 adjacent to each other in the X-direction (that is, between the insulators 43a and 43b), the more the finger may be prevented from twisting. However, if that distance is excessively large, there is a risk of bending of the stack 20 during the replacement processing. To address such an issue, in the first modification, by providing the plurality of second columnar bodies CLd as a reinforcing structure between the third insulators 43 adjacent to each other in the X direction, the finger may be prevented from twisting and the bending of the stack 20 may also be prevented. Further, since the stack 20 between the third insulators 43 adjacent to each other is reinforced by the plurality of second columnar bodies CLd, the distance (interval) between the third insulators 43 adjacent to each other may be increased as compared with the first embodiment. As a result, in the semiconductor device according to the first modification, the twisting of the finger may be further prevented as compared with the first embodiment.

Here, the second columnar body CLd functions as a reinforcing structure. Therefore, a film configuration of the second columnar body CLd is not particularly limited, but may be the same as a film configuration of the columnar body CL (see FIGS. 4A and 4B) from the viewpoint of manufacturing efficiency.

Further, with the configuration of the first modification, in addition to the above effects, the influence of the read voltage of the string in the unselected state may be avoided as in the first embodiment.

Manufacturing Method

Next, a method of manufacturing the semiconductor storage device 1 according to the first embodiment will be described. FIGS. 6 to 14C are cross-sectional diagrams to illustrate processes of the method of manufacturing the semiconductor storage device 1 according to the first embodiment. FIG. 14A is a plan view diagram to illustrate a manufacturing process of the method. FIG. 14B illustrates a cross-sectional view taken along the X-X' plane in FIG. 14A, and FIG. 14C illustrates a cross-sectional view taken along the Y-Y' plane in FIG. 14A.

Figure 6:
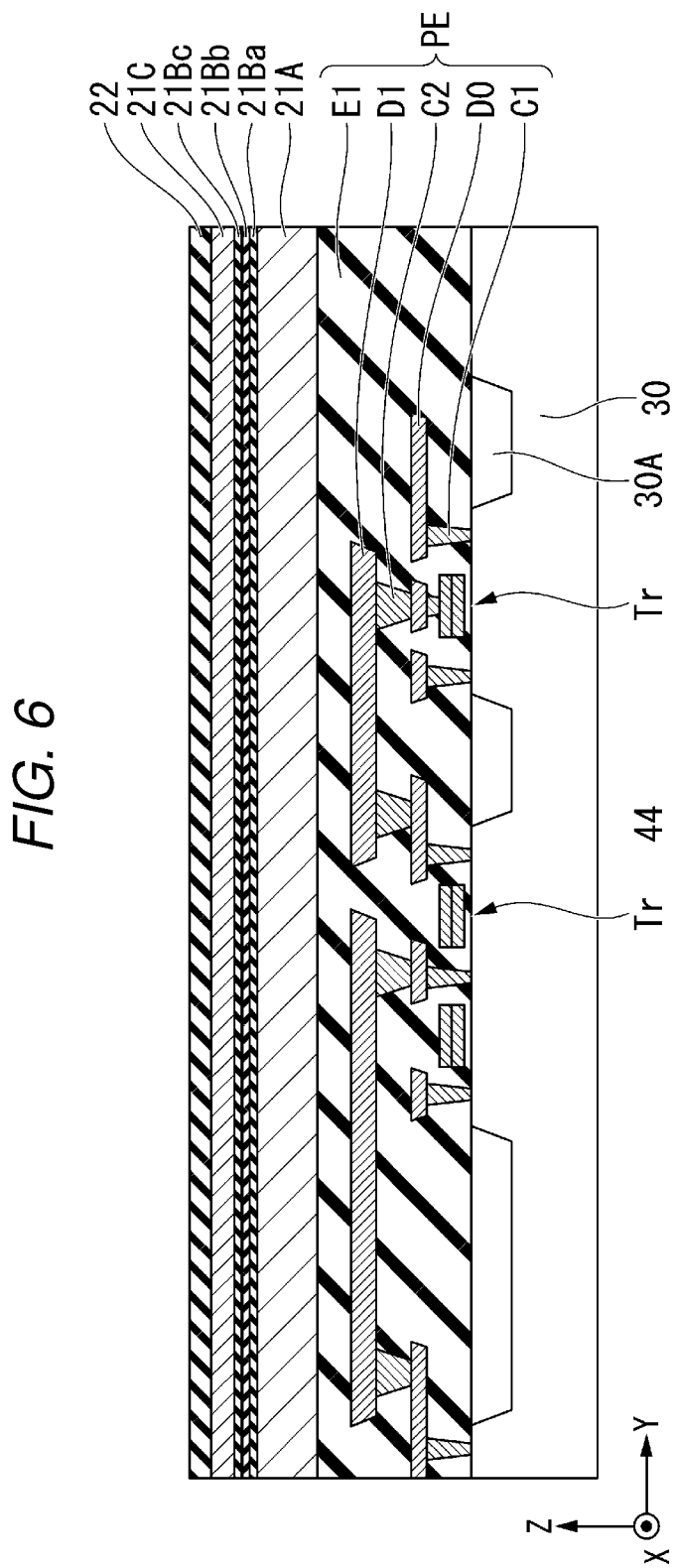
FIGS. 6-13 are cross-sectional diagrams to illustrate processes of a method of manufacturing the semiconductor storage device according to a first embodiment.

First, as illustrated in FIG. 6, the element isolation region 30A is formed in the substrate 30, and the transistor Tr is formed in the circuit layer PE (see FIG. 1). The transistor Tr may be fabricated by a known method. Further, in the circuit layer PE, the plurality of wiring layers D0 and D1 and the plurality of vias C1 and C2 which are electrically connected to the transistor Tr are formed in the insulating layer E1. The plurality of wiring layers D0 and D1 and the plurality of vias C1 and C2 may be fabricated by a known method.

Next, the semiconductor layer 21A, an intermediate film 21Ba, a first sacrificial film 21Bb, an intermediate film 21Bc, the semiconductor layer 21C, and the insulating layer 22 are stacked on the circuit layer PE in this order. The intermediate film 21Ba and the intermediate film 21Bc contain, for example, a silicon oxide. The first sacrificial film 21Bb is, for example, a silicon nitride. The semiconductor layer 21A, the semiconductor layer 21C, and the insulating layer 22 are the same as those described above.

Figure 7:
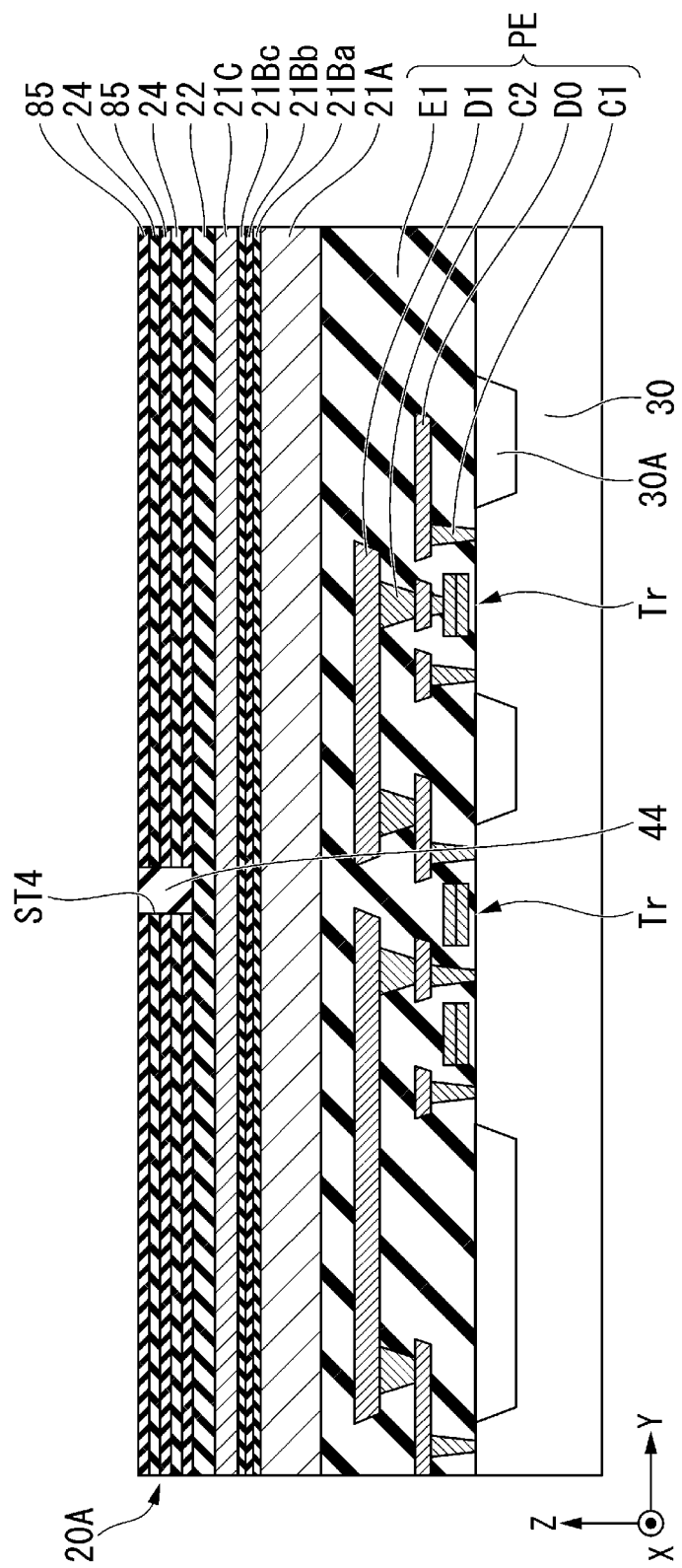

Next, as illustrated in FIG. 7, the insulating layer 24 and a sacrificial film 85 are alternately stacked on the insulating layer 22 to form a first stack 20A. At this time, the insulating layer 24 and the sacrificial film 85 are stacked to a height corresponding to the second conductive layer 25B (the source-side select gate line SGS), that is, to a height corresponding to the fourth insulator 44.

The insulating layer 24 is as described above and contains, for example, a silicon oxide. The sacrificial film 85 contains, for example, a silicon nitride.

Next, the fourth slit ST4 extending in the X direction is formed in the stacked insulating layer 24 and sacrificial film 85 so as to penetrate the first stack 20A. The fourth slit ST4 reaches the middle of the insulating layer 22 from an upper surface of an uppermost one of the sacrificial films 85. The fourth slit ST4 is fabricated by etching. For example, anisotropic etching is performed from the upper surface of the upper most one of the sacrificial films 85 to the insulating layer 22. The anisotropic etching is, for example, reactive ion etching (RIE). Thereafter, the fourth slit ST4 is filled with an insulator to form the fourth insulator 44. The fourth insulator 44 contains, for example, a silicon oxide.

Figure 8:
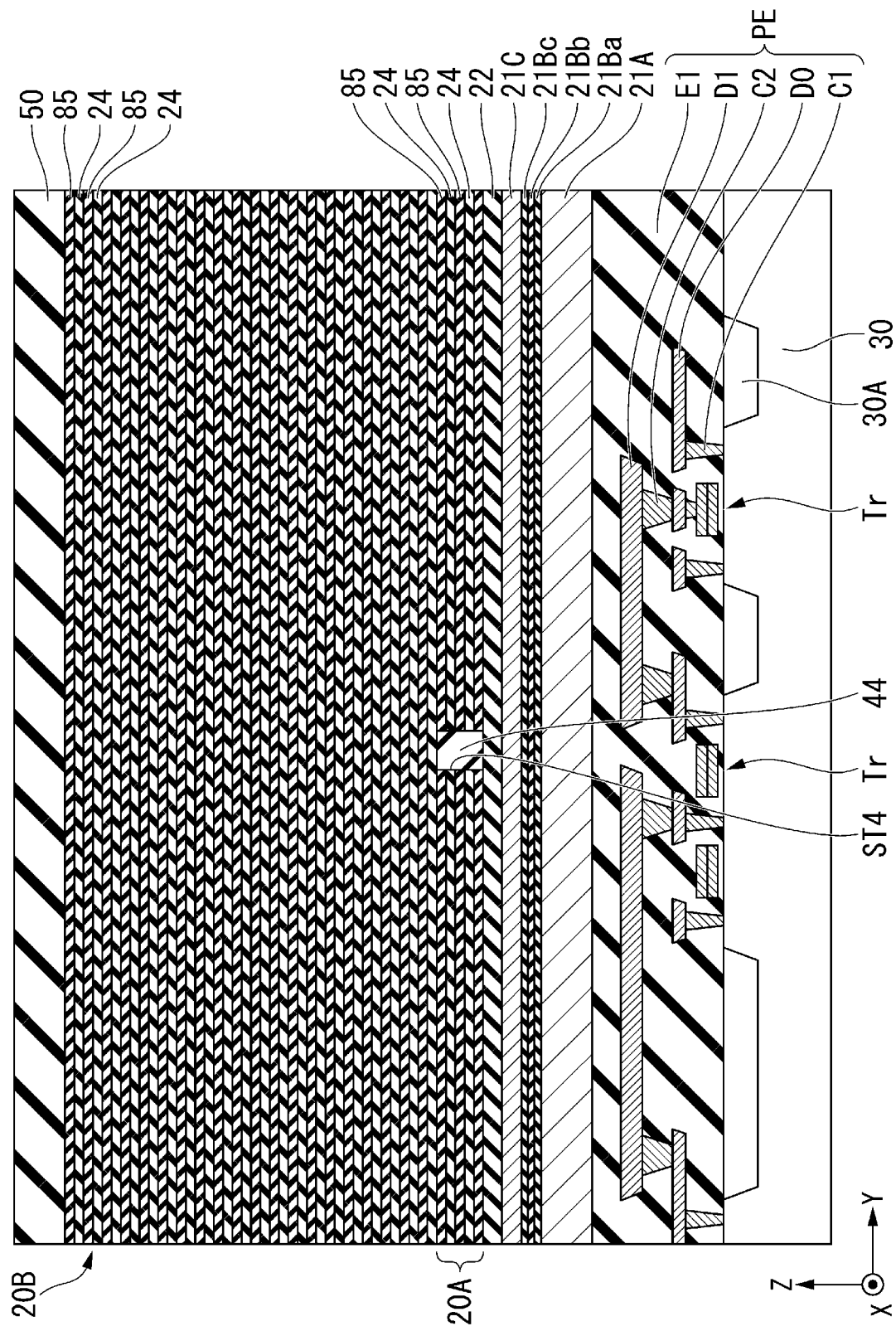

Next, as illustrated in FIG. 8, the insulating layer 24 and the sacrificial film 85 are alternately stacked on the first stack 20A and the fourth insulator 44 in succession, and in turn, the cover insulating layer 50 is formed on the uppermost sacrificial film 85 to form a second stack 20B.

Figure 9:
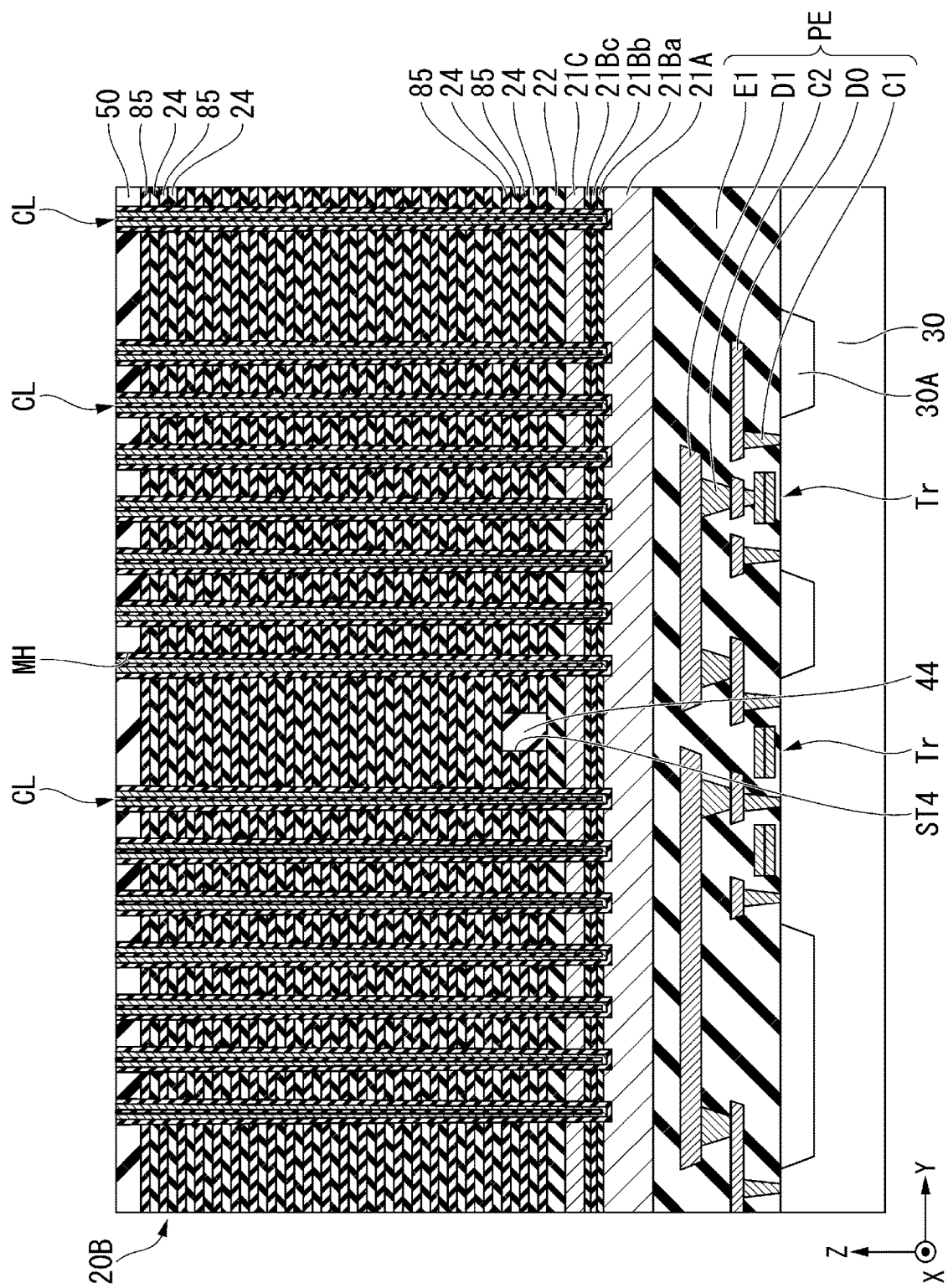

Next, as illustrated in FIG. 9, the memory hole MH is formed in the second stack 20B illustrated in FIG. 8. The memory hole MH reaches the middle of the semiconductor layer 21A from the upper surface of the second stack 20B. The memory hole MH is fabricated by etching. For example, anisotropic etching is performed from the upper surface of the second stack 20B to the semiconductor layer 21A. The anisotropic etching is, for example, reactive ion etching (RIE).

Next, the memory stacked film 62, the semiconductor layer 61, and the insulating core 60 are formed in the memory hole MH in this order. The memory hole MH is filled with the memory stacked film 62, the semiconductor layer 61, and the insulating core 60. Thus, the columnar body CL is formed in the memory hole MH.

Figure 10:
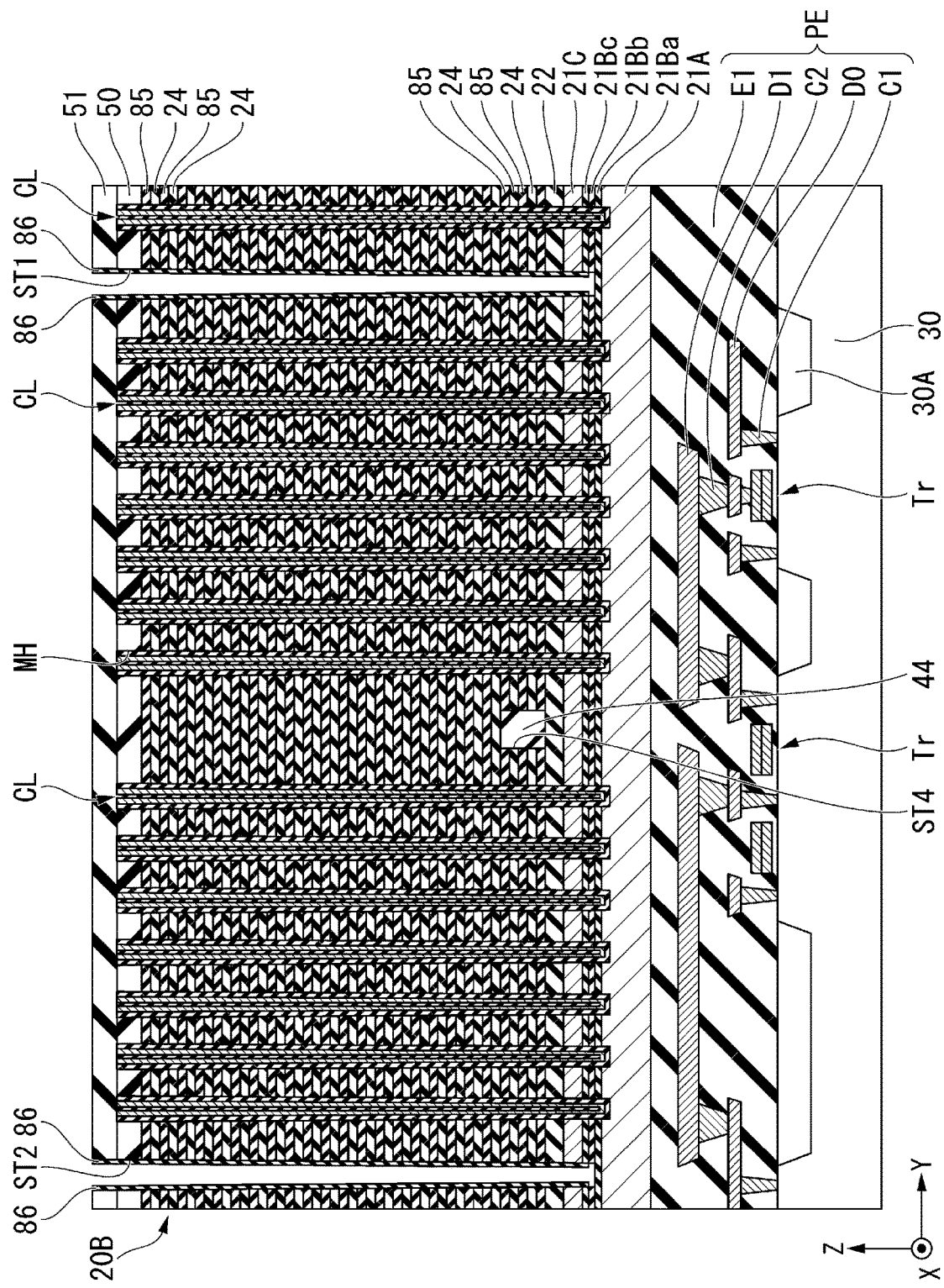

Next, as illustrated in FIG. 10, a cover insulating layer 51 is formed on the stack in which the columnar body CL is formed. Thereafter, the first slit ST1 and the second slit ST2 are formed in the second stack 20B, and the third slit SST illustrated to FIGS. 3A and 3B is formed. Although the third slit SST is not specifically illustrated in FIG. 10, as illustrated in FIGS. 3A and 3B, the third slit SST extends in the X direction and is formed in a broken line shape in a plan view from the Z direction. The first slit ST1 and the second slit ST2 are deep slits, and both extend from the upper surface of the second stack 20B to the middle of the sacrificial film 21Bb. Similarly, the third slit SST is also a deep slit, and extends from the upper surface of the second stack 20B to the middle of the sacrificial film 21Bb. Therefore, a part of the fourth insulator 44 formed so as to extend in the X direction in a lower portion of the second stack 20B is removed by the third slit SST, and remains only between the third slits SST adjacent to each other in the X direction (see FIG. 3A). The first slit ST1, the second slit ST2, and the third slit SST are formed by anisotropic etching. A stopper film 86 is formed on the inner wall of each of the first slit ST1, the second slit ST2, and the third slit SST. The stopper film 86 is, for example, a silicon oxide.

Figure 11:
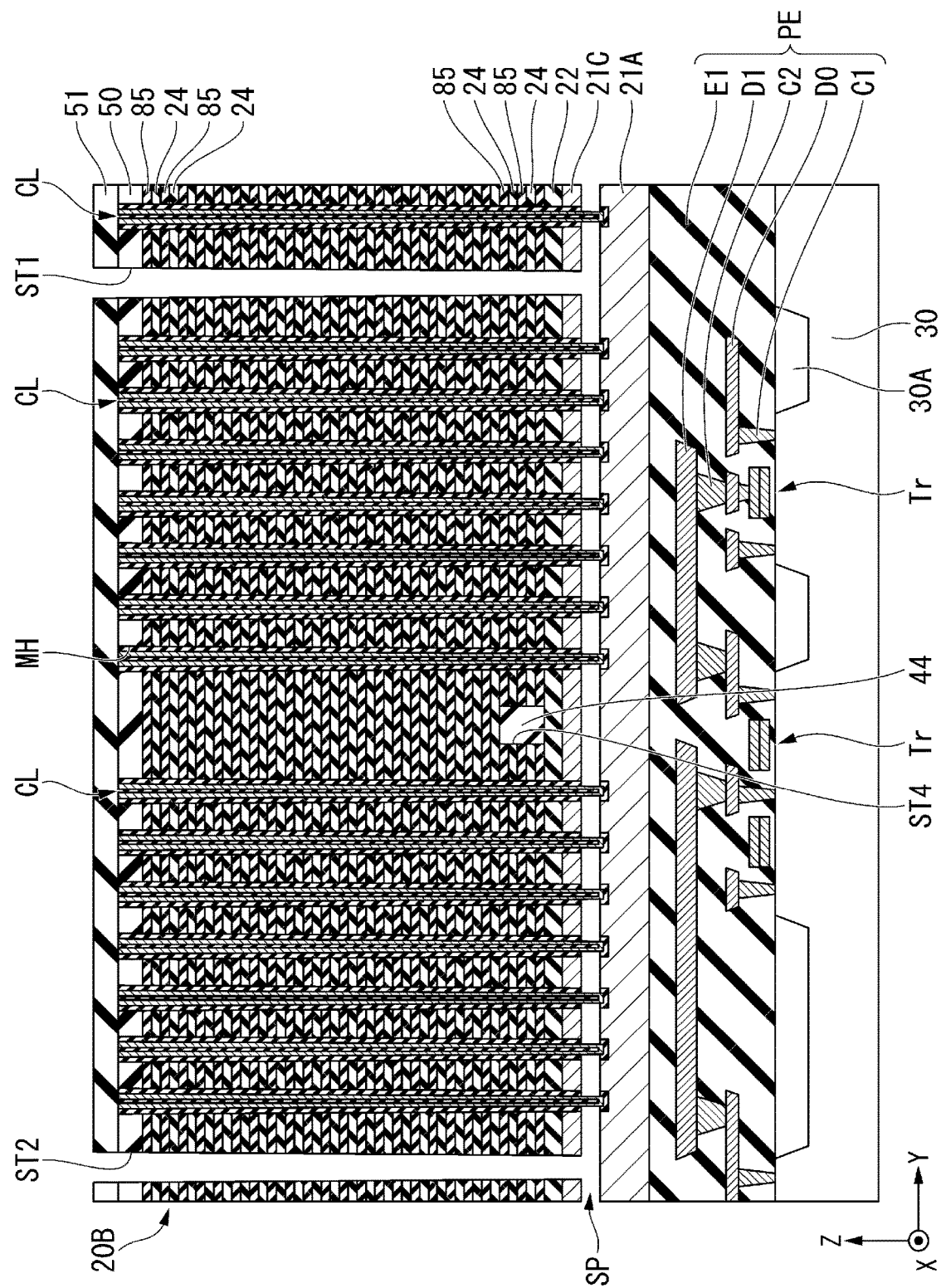

Next, as illustrated in FIG. 11, the sacrificial film 21Bb is isotropically etched through the first slit ST1, the second slit ST2, and the third slit SS. The sacrificial film 21Bb is removed by isotropic etching. The isotropic etching is performed using an etchant capable of etching a silicon nitride faster than a silicon oxide. A part of the memory stacked film 62 is also removed by new etching. A portion of the memory stacked layer 62 which is exposed by removing the sacrificial film 21Bb is removed. By removing a part of the memory stacked film 62, a part of the semiconductor layer 61 is exposed. The etching of the memory stacked film 62 is performed using an etchant capable of etching a silicon oxide faster than a silicon nitride. In the etching of the memory stacked film 62, the intermediate films 21Ba and 21Bc and the stopper film 86 are also removed together with the memory stacked film 62. A space Sp is formed between the semiconductor layer 21A and the semiconductor layer 21C.

Figure 12:
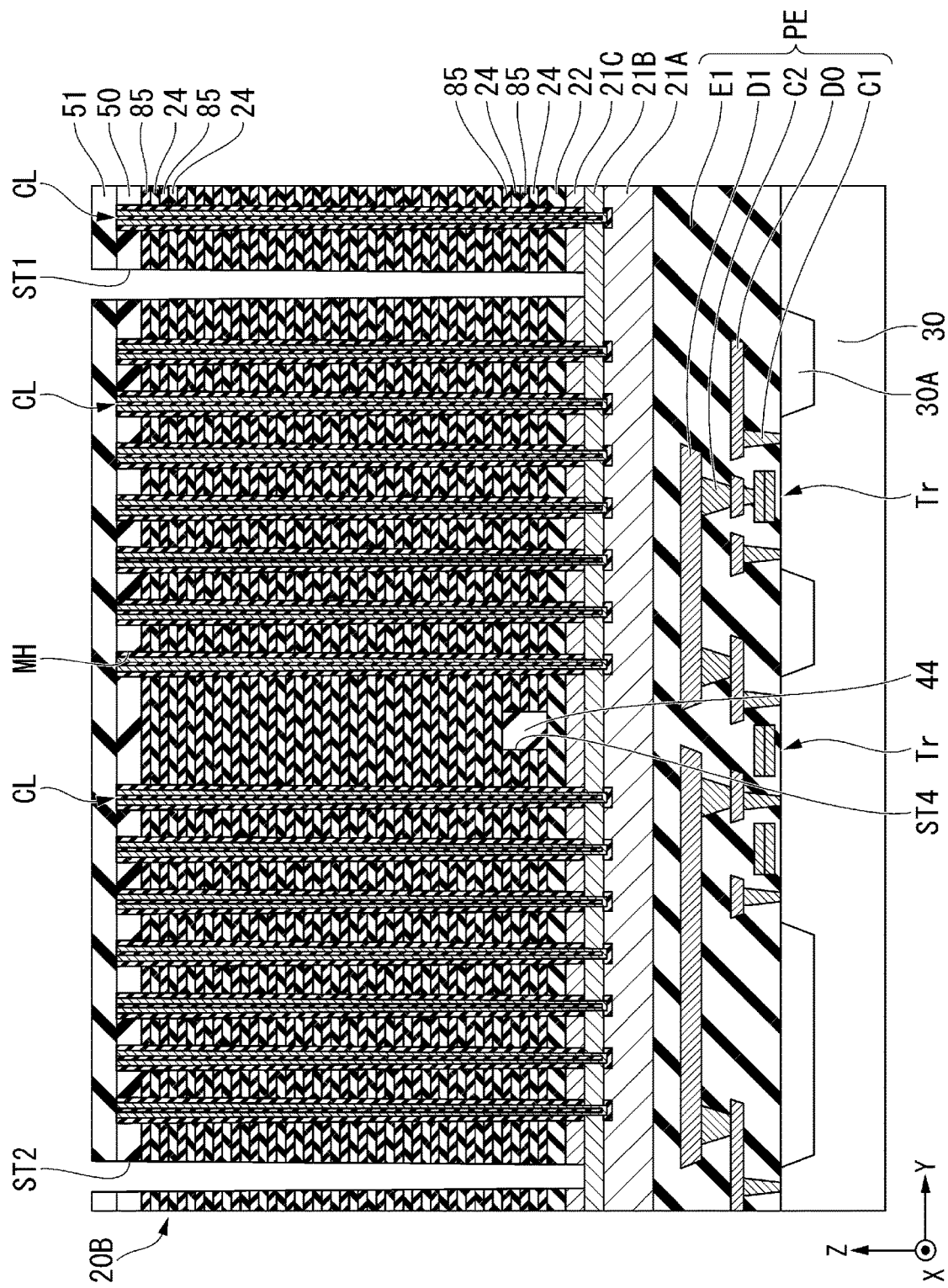

Next, as illustrated in FIG. 12, the space Sp is filled with a semiconductor material through the first slit ST1, the second slit ST2, and the third slit SST to form the semiconductor layer 21B. Thus, the exposed semiconductor layer 61 and the semiconductor layer 21B come into contact with each other. The material of the semiconductor layer 21B is as described above. The semiconductor layer 21B contains, for example, phosphorus.

Figure 13:
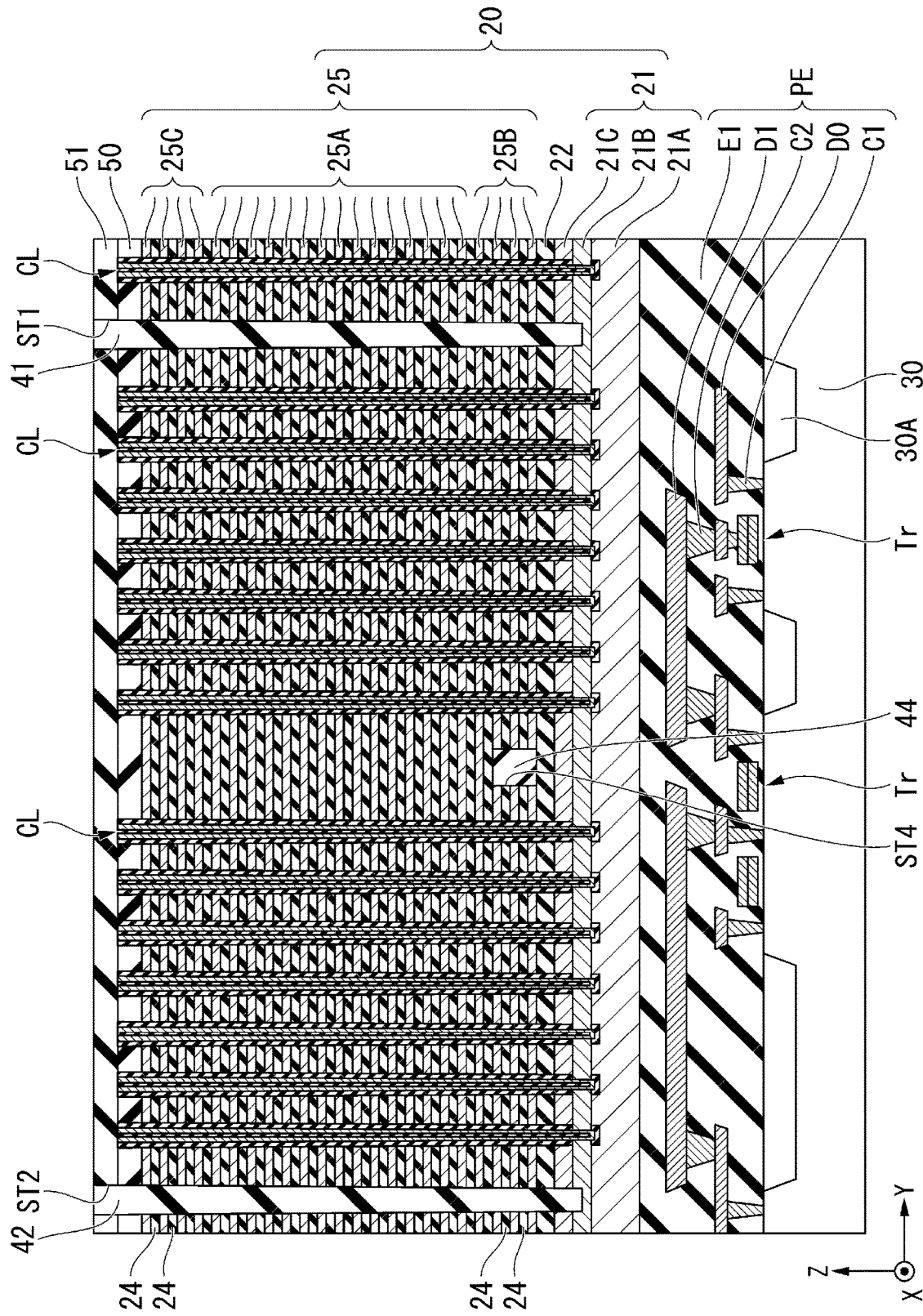
Figure 14B:
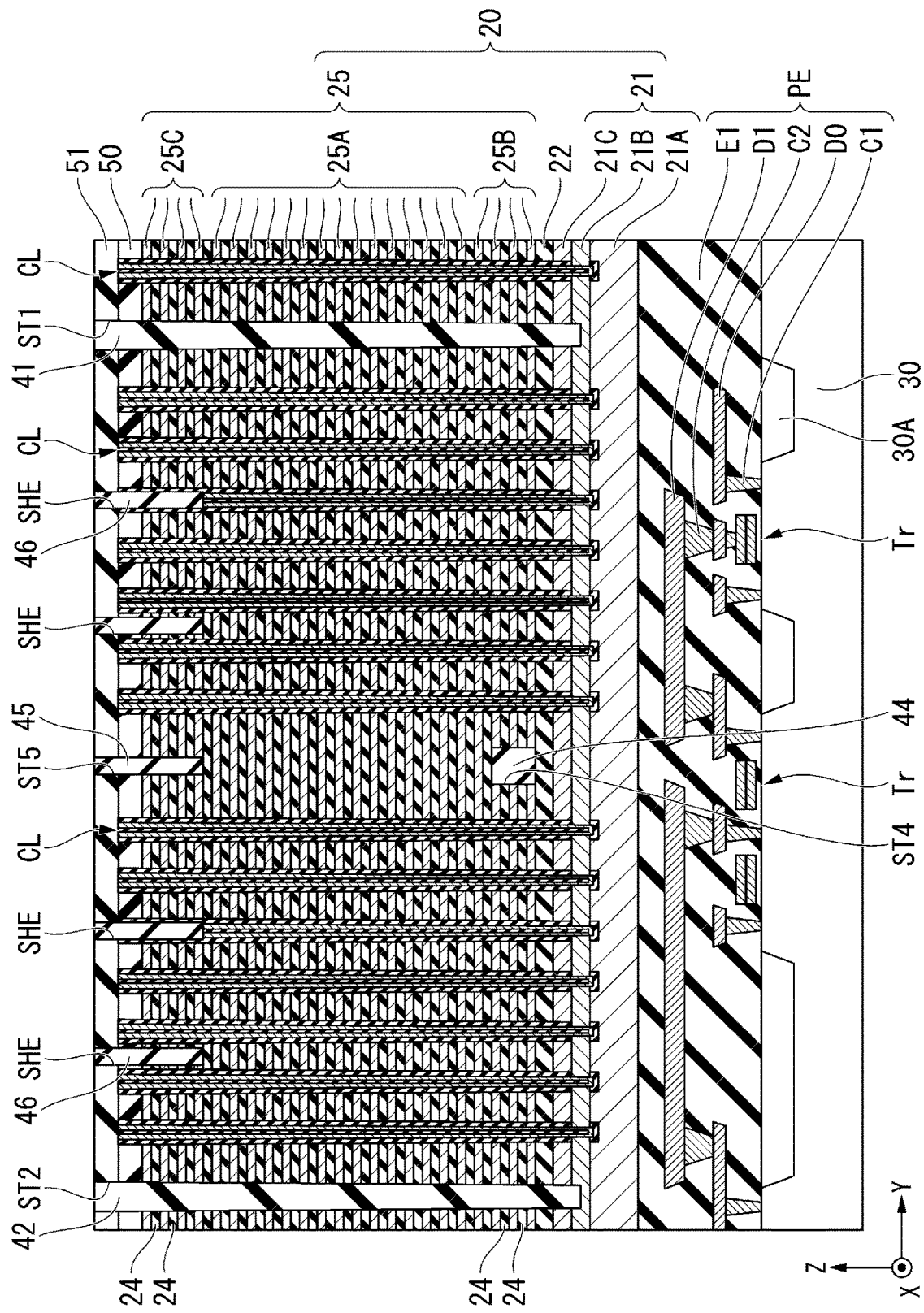
FIGS. 14B-14C are cross-sectional diagrams to illustrate processes of a method of manufacturing a semiconductor storage device according to a first embodiment.
Figure 14C:
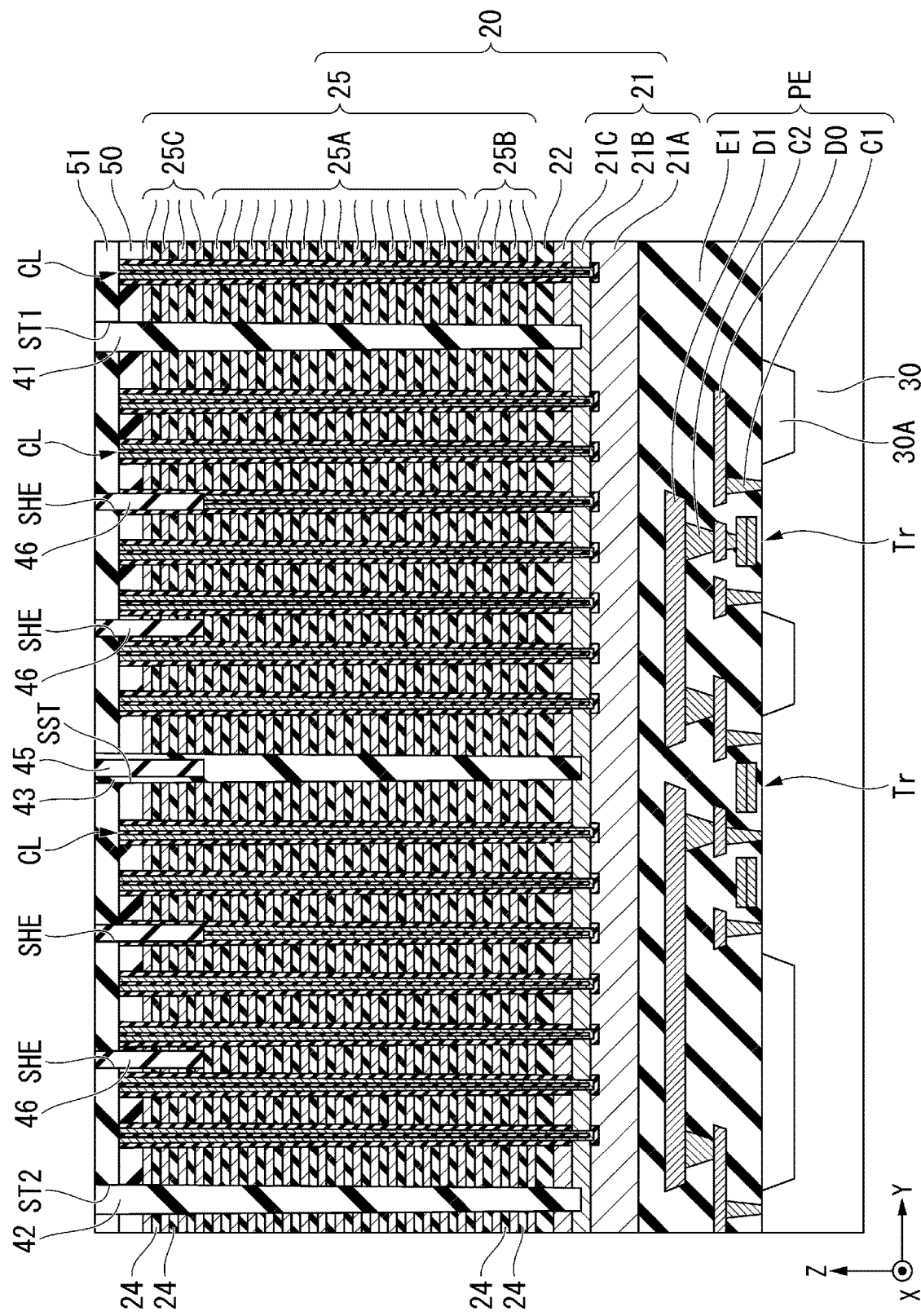

Next, as illustrated in FIG. 13, the sacrificial films 85 are replaced with the conductive layers 25 (25A, 25B and 25C). First, the sacrificial layers 85 are removed through the first slit ST1, the second slit ST2, and the third slit SST. The sacrificial films 85 are removed by isotropic etching. The isotropic etching uses an etchant capable of etching a silicon nitride faster than a silicon oxide and polysilicon. Thereafter, a portion from which the sacrificial layers 85 are removed is filled with a conductive material to form the conductive layers 25 (25A, 25B, and 25C). Thus, the stack 20 is formed.

Then, by filling the first slit ST1, the second slit ST2, and the third slit SST with an insulator, the first insulator 41, the second insulator 42, and the third insulator 43 are formed in the first slit ST1, the second slit ST2, and the third slit SST, respectively.

Next, as illustrated in FIGS. 14A to 14C, the fifth slit ST5 and the sixth slit SHE are formed. Both the fifth slit ST5 and the sixth slit SHE reach a depth corresponding to the third conductive layer 25C (e.g., the drain-side select gate line SGD) from the upper surface of the stack 20. The fifth slit ST5 is formed so as to span between the third insulators 43 (insulators 43a and 43b) adjacent to each other in the X direction. The end of the fifth slit ST5 and the end of the third insulator 43 may be formed so as to be in contact with each other. That is, both ends of the fifth slit ST5 in the X direction may be formed so as to be in contact with the ends of the insulators 43a and 43b. The fifth slit ST5 and the sixth slit SHE are fabricated by etching. For example, anisotropic etching is performed from the upper surface of the stack 20 to a depth corresponding to the third conductive layer 25C (e.g., the drain-side select gate line SGD). The anisotropic etching is, for example, reactive ion etching (RIE).

Next, by filling the fifth slit ST5 and the sixth slit SHE with an insulator, the fifth insulator 45 and the sixth insulator 46 are formed in the fifth slit ST5 and the sixth slit SHE, respectively. At this time, both the fifth insulator 45 and the sixth insulator 46 are formed so as to extend in the X direction.

Through the above steps, the semiconductor storage device 1 according to the first embodiment is fabricated. In addition, the manufacturing process illustrated herein is an example, and other steps may be inserted between the respective steps.

Next, a method of manufacturing the semiconductor storage device 1A of the first modification will be described. FIGS. 15 to 20C are cross-sectional diagrams to illustrate a method of manufacturing the semiconductor storage device 1A according to the first modification. FIG. 20A is a plan view diagram to illustrate a manufacturing process in the method. FIG. 20B illustrates a cross-sectional view taken along the Z-Z' plane in FIG. 20A, and FIG. 20C illustrates a cross-sectional view taken along the W-W' plane in FIG. 20A.

The method of manufacturing the semiconductor storage device 1A according to the first modification is the same as that of the first embodiment up to the step of alternately stacking the insulating layer 24 and the sacrificial film 85 illustrated in FIG. 8. Therefore, in the following, the process after the step of alternately stacking the insulating layer 24 and the sacrificial layer 85 will be described, and the illustration and description before that step will be omitted.

After the insulating layer 24 and the sacrificial film 85 are alternately stacked to form the second stack 20B, as illustrated in FIG. 15, the memory hole MH is formed. The memory hole MH reaches the middle of the semiconductor layer 21A from the upper surface of the second stack 20B illustrated in FIG. 8. At this time, in the first embodiment, the memory hole MH is not formed in the stack 20 located above the fourth insulator 44. In contrast, in the first modification, a plurality of memory holes MH are also formed at positions overlapping with at least a part of the fourth insulator 44 in the Z direction in order to form the plurality of second columnar bodies CLd. The memory holes MH are fabricated by etching. For example, anisotropic etching is performed from the upper surface of the second stack 20B to the semiconductor layer 21A. The anisotropic etching is, for example, reactive ion etching (RIE).

Next, the memory stacked film 62, the semiconductor layer 61, and the insulating core 60 are formed in the memory holes MH in this order. The memory holes MH are filled with the memory stacked film 62, the semiconductor layer 61, and the insulating core 60. At this time, similarly, the memory stacked film 62, the semiconductor layer 61, and the insulating core 60 are also formed in this order in the memory holes MH corresponding to the second columnar bodies CLd. Thus, the columnar bodies CL and the second columnar bodies CLd are formed in the memory holes MH.

Figure 16:
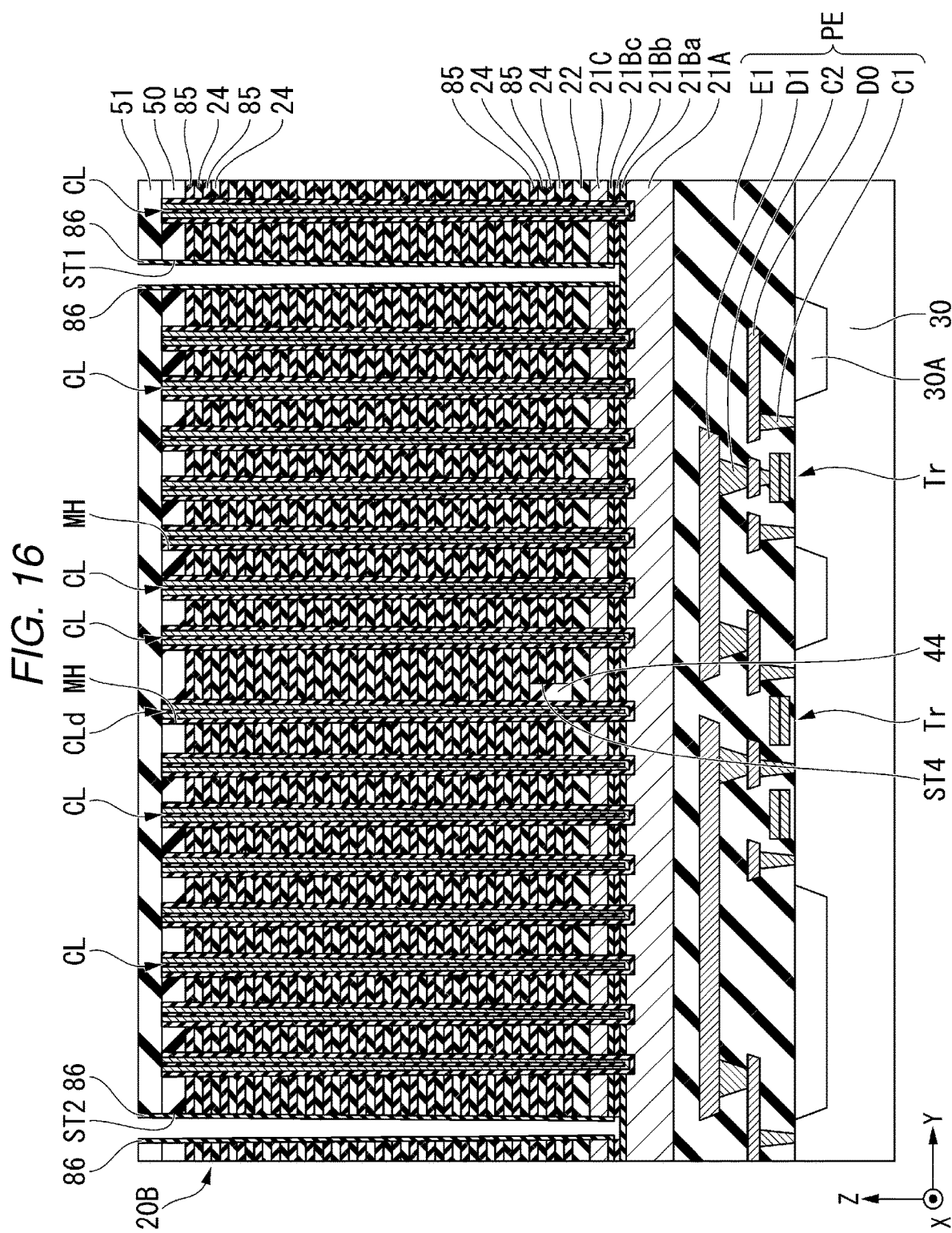

Next, as illustrated in FIG. 16, the cover insulating layer 51 is formed on the second stack 20B in which the columnar bodies CL and the second columnar bodies CLd are formed. Thereafter, similarly to the first embodiment, the first slit ST1 and the second slit ST2 are formed in the second stack 20B, and the third slit SST illustrated to FIG. 5A is formed. Although not illustrated in FIG. 16, the third slit SST extends in the X direction and is formed in a broken line shape in a plan view from the Z direction as illustrated in FIG. 5A. The first slit ST1 and the second slit ST2 are deep slits, and both extend from the upper surface of the stack to the middle of the sacrificial film 21Bb. Similarly, the third slit SST is also a deep slit and extends from the upper surface of the second stack 20B to the middle of the sacrificial film 21Bb. Therefore, a part of the fourth insulator 44 formed so as to extend in the X direction in a lower portion of the second stack 20B is removed by the third slit SST, and remains only between the third slits SST adjacent to each other in the X direction (see FIG. 5A). The first slit ST1, the second slit ST2, and the third slit SST are formed by anisotropic etching. The stopper film 86 is formed on the inner wall of each of the first slit ST1, the second slit ST2, and the third slit SST. The stopper film 86 is, for example, a silicon oxide.

Figure 17:
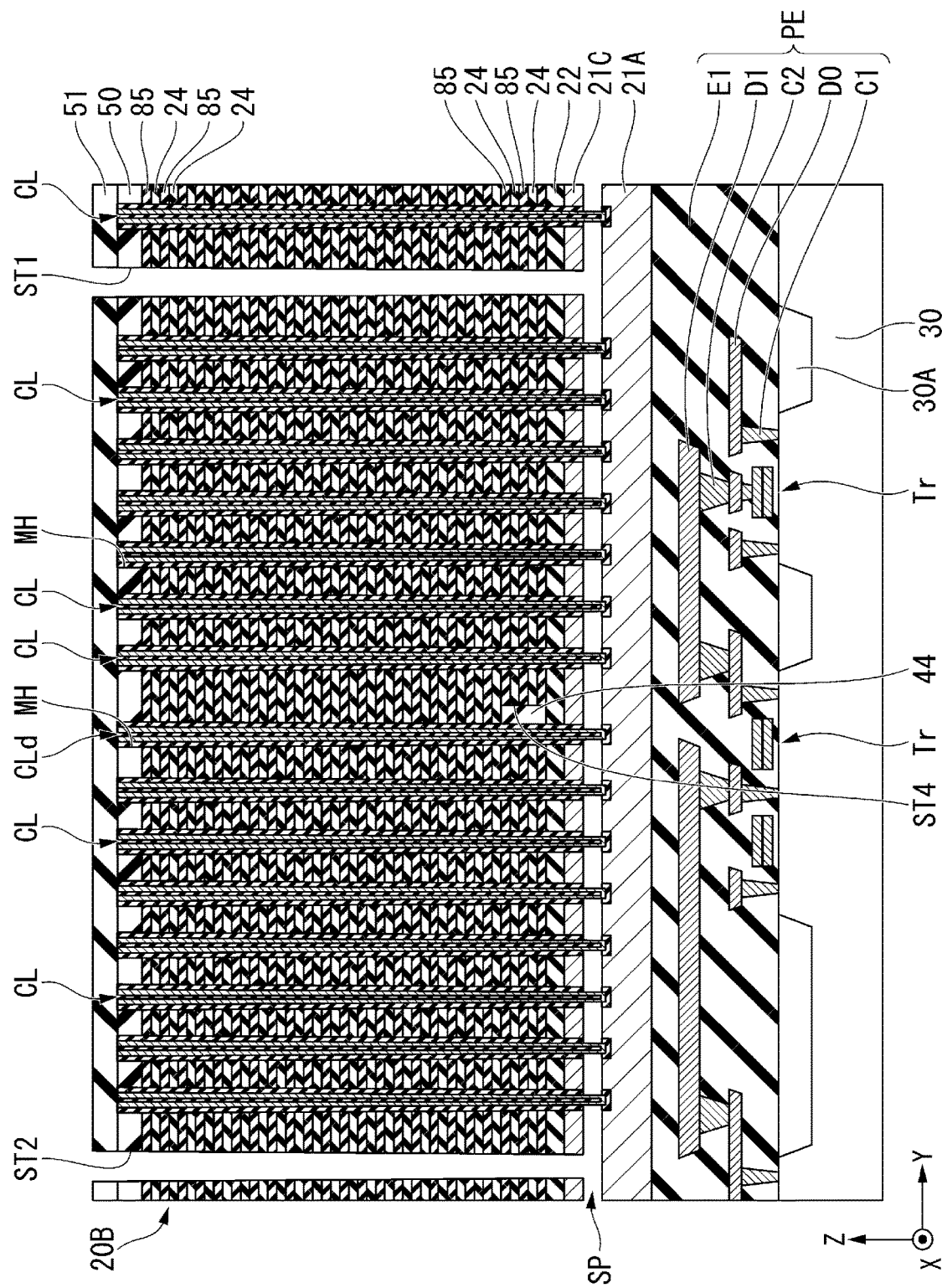

Next, as illustrated in FIG. 17, the sacrificial film 21Bb is isotropically etched through the first slit ST1, the second slit ST2, and the third slit SST. The sacrificial film 21Bb is removed by isotropic etching. The isotropic etching is performed using an etchant capable of etching a silicon nitride faster than a silicon oxide. Further, a part of the memory stacked film 62 is also removed by etching. A portion of the memory stacked layer 62 which is exposed by removing the sacrificial layer 21Bb is removed. By removing a part of the memory stacked film 62, a part of the semiconductor layer 61 is exposed. The etching of the memory stacked film 62 is performed using an etchant capable of etching a silicon oxide faster than a silicon nitride. In the etching of the memory stacked film 62, the intermediate films 21Ba and 21Bc and the stopper film 86 are also removed together with the memory stacked film 62. The space Sp is formed between the semiconductor layer 21A and the semiconductor layer 21C.

Figure 18:
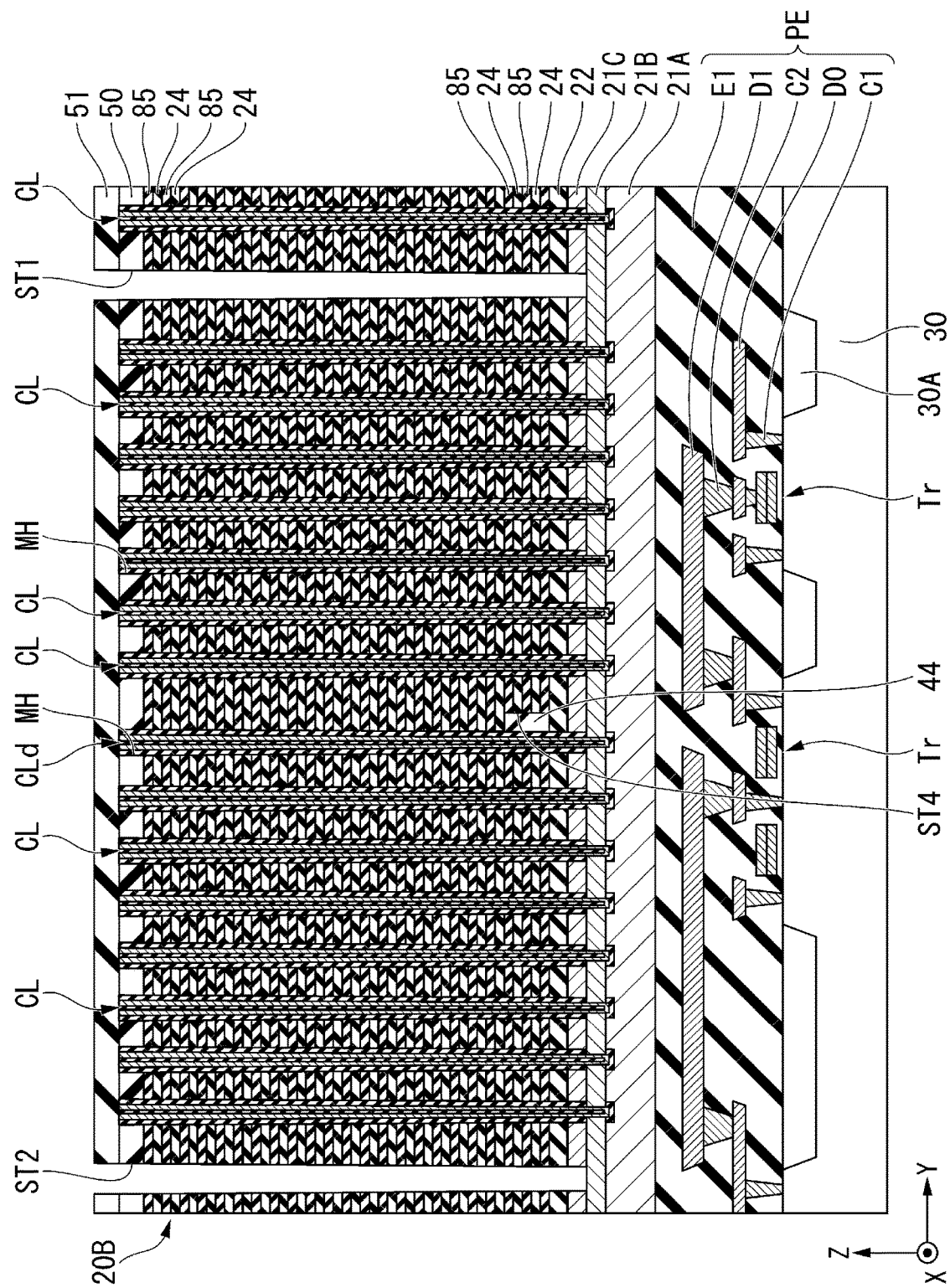

Next, as illustrated in FIG. 18, the space Sp is filled with a semiconductor material through the first slit ST1, the second slit ST2, and the third slit SST to form the semiconductor layer 21B. Thus, the exposed semiconductor layer 61 and the semiconductor layer 21B come into contact with each other. The material of the semiconductor layer 21B is as described above. The semiconductor layer 21B contains, for example, phosphorus.

Figure 19:
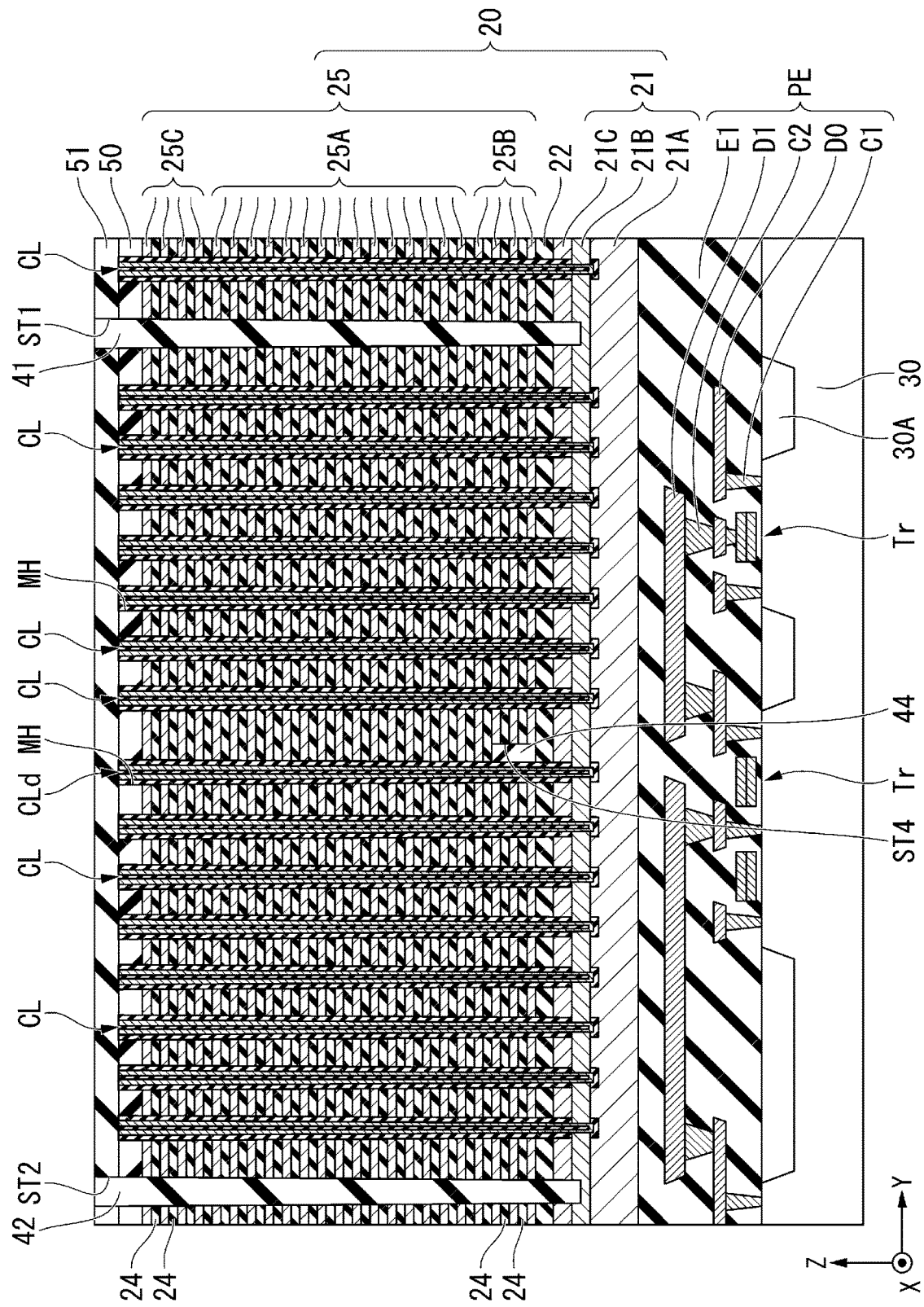
Figure 20B:
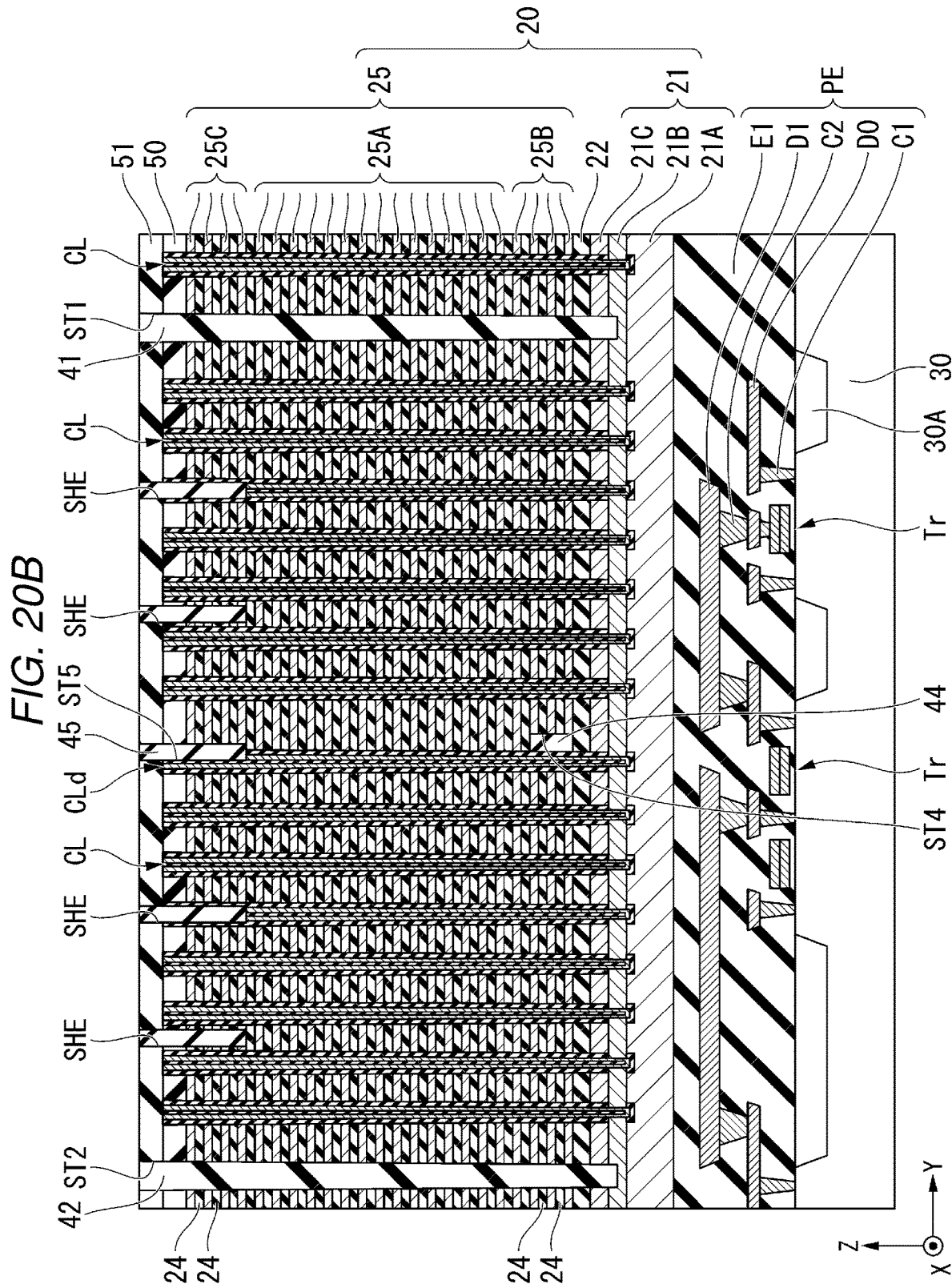

Next, as illustrated in FIG. 19, the sacrificial films 85 is replaced with the conductive layers 25 (25A, 25B and 25C). Specifically, similarly to the first embodiment, the sacrificial films 85 are first removed through the first slit ST1, the second slit ST2, and the third slit SST. The sacrificial films 85 are removed by isotropic etching. The isotropic etching uses an etchant that can etch silicon nitride faster compared to silicon oxide and polysilicon. Thereafter, a portion from which the sacrificial layers 85 are removed is filled with a conductive material to form the conductive layers 25 (25A, 25B, and 25C). As a result, the stack 20 is formed.

Then, by filling the first slit ST1, the second slit ST2, and the third slit SST with an insulator, the first insulator 41, the second insulator 42 and the third insulator 43 are formed in the first slit ST1, the second slit ST2, and the third slit SST, respectively.

Next, as illustrated in FIGS. 20A to 20C, the fifth slit ST5 and the sixth slit SHE are formed. Both the fifth slit ST5 and the sixth slit SHE reach a depth corresponding to the third conductive layer 25C (e.g., the drain-side select gate line SGD) from the upper surface of the stack 20, similarly to the first embodiment. The fifth slit ST5 is formed so as to span between the third insulators 43 (the insulators 43a and 43b) adjacent to each other in the X direction. The end of the fifth slit ST5 and the end of the third insulator 43 may be formed so as to be in contact with each other. That is, both ends of the fifth slit ST5 in the X direction may be formed so as to be in contact with the ends of the insulators 43a and 43b. The fifth slit ST5 and the sixth slit SHE are fabricated by etching, similarly to the first embodiment. By forming the fifth slit ST5, a part of at least some of the second columnar bodies CLd is removed.

Next, by filling the fifth slit ST5 and the sixth slit SHE with an insulator, the fifth insulator 45 and the sixth insulator 46 are formed in the fifth slit ST5 and the sixth slit SHE, respectively. At this time, both the fifth insulator 45 and the sixth insulator 46 are formed so as to extend in the X direction.

Through the above steps, the semiconductor storage device 1A according to the first modification is fabricated. In addition, the manufacturing process illustrated here is an example, and other steps may be inserted between the respective steps.

Although some embodiments have been described above, the embodiments are not limited to the above examples. For example, the memory stacked film may be a ferroelectric film provided in a Ferroelectric FET (FeFET) memory that stores data according to the direction of polarization. The ferroelectric film is formed of, for example, a hafnium oxide.

According to at least one embodiment described above, the physical strength against the twisting of the finger may be improved by the third insulator 43 (the insulators 43a and 43b) arranged in a broken line shape. Furthermore, the fourth insulator 44 and the fifth insulator 45 are provided between the third insulators 43 (the insulators 43a and 43b) adjacent to each other in the X direction so as to divide the second conductive layer 25B (e.g., the source-side select gate line SGS) and the third conductive layer 25C (e.g., the drain-side select gate line SGD). Thus, during data write and read, one finger in the block may be set to a selected state, and the other finger delimited by the third insulators 43 may be set to an unselected state. Then, since the string STR in the finger in the unselected state (that is, a finger that is not being read) becomes a floating state, when a voltage is applied to the first conductive layer 25A (WL), the string STR is also concomitantly boosted, so that the potential difference between the string and the first conductive layer 25A (WL) may be maintained. As a result, the influence on the read voltage of the string in the unselected state may be avoided, and read disturbance may be improved.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
    a stack including a plurality of first metal layers stacked in a first direction, a second metal layer disposed below the plurality of first metal layers, and a third metal layer disposed above the plurality of first metal layers;
    a plurality of first columns penetrating the stack in the first direction, each of the first columns including a semiconductor layer;
    a first insulator penetrating the stack in the first direction and extending in a second direction intersecting the first direction;
    a second insulator at a position separated from the first insulator in a third direction intersecting the first and second directions, the second insulator penetrating the stack in the first direction and extending in the second direction, the plurality of first columns including at least 10 first columns arranged in a zigzag shape in the third direction between the first insulator and the second insulator; and
    a third insulator including a first portion that divides the second metal layer between the first insulator and the second insulator in the third direction and a second portion that is above the first portion and divides the third metal layer between the first insulator and the second insulator in the third direction, the third insulator not dividing the plurality of first metal layers between the first insulator and the second insulator.

2. The semiconductor storage device according to claim 1, wherein
    the first portion of the third insulator includes a fourth insulator extending in the first and second directions, and
    the second portion of the third insulator includes a fifth insulator extending in the first and second directions above the fourth insulator.

3. The semiconductor storage device according to claim 2, wherein a width of the fifth insulator in the third direction is less than a width of the fourth insulator in the third direction.

4. The semiconductor storage device according to claim 2, wherein the plurality of first conductive layers extend in the third direction above the fourth insulator.

5. The semiconductor storage device according to claim 2, wherein the plurality of first conductive layers extend in the third direction below the fifth insulator.

6. The semiconductor storage device according to claim 2, further comprising:
    a plurality of second columns penetrating the stack in the first direction and aligned in the second direction along the fourth and fifth insulators, each of the second columns including a semiconductor layer.

7. The semiconductor storage device according to claim 6, wherein the plurality of second columns includes a first row of second columns aligned in the second direction and a second row of second columns aligned in the second direction.

8. The semiconductor storage device according to claim 7, wherein the fifth insulator is between the first row of second columns and the second row of second columns in the third direction.

9. The semiconductor storage device according to claim 6, wherein a layer structure of at least one of the plurality of second columns is substantially same as a layer structure of one of the plurality of first columns.

10. The semiconductor storage device according to claim 1, wherein one of the divided regions of the second conductive layer is a first gate line, and another one of the divided regions of the second conductive layer is a second gate line.

11. The semiconductor storage device according to claim 10, wherein one of the divided regions of the third conductive layer is a third gate line, and another one of the divided regions of the second conductive layer is a fourth gate line.

12. The semiconductor storage device according to claim 11, further comprising:
a control circuit configured to:
apply a predetermined voltage to the first and third select gate lines, but not to the second and fourth gate lines, during a first read operation, and
apply the predetermined voltage to the second and fourth select gate lines, but not to the first and third gate lines, during a second read operation.

* * * * *